US012751079B2

(12) United States Patent
Lin

(10) Patent No.: US 12,751,079 B2
(45) Date of Patent: Sep. 29, 2026

(54) METHOD FOR FORMING A SEMICONDUCTOR DEVICE BY RECESSING SEMICONDUCTOR LAYERS AND INNER SPACERS

(71) Applicant: Taiwan Semiconductor Manufacturing Company, Ltd., Hsinchu (TW)

(72) Inventor: Ta-Chun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 432 days.

(21) Appl. No.: 18/350,933

(22) Filed: Jul. 12, 2023

(65) Prior Publication Data

US 2025/0022877 A1 Jan. 16, 2025

(51) Int. Cl.
*H10D 30/01* (2025.01)
*H10D 30/00* (2025.01)
(Continued)

(52) U.S. Cl.
CPC ........... *H10D 84/83* (2025.01); *H10D 30/014* (2025.01); *H10D 30/0195* (2025.01); *H10D 30/43* (2025.01); *H10D 30/503* (2025.01); *H10D 30/506* (2025.01); *H10D 30/6735* (2025.01); *H10D 62/121* (2025.01); *H10D 64/015* (2025.01); *H10D 64/017* (2025.01); *H10D 64/018* (2025.01); *H10D 64/258* (2025.01);
(Continued)

(58) Field of Classification Search
CPC ....... H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 30/502–506; H10D 62/121; H10D 84/0147; H10D 84/0184; H10D 64/021; H10D 64/015; H10D 64/018; H10D 64/675–679; H10D 30/507–509; H10D 30/0195–0197
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Younes Boulghassoul
(74) *Attorney, Agent, or Firm* — McClure, Qualey & Rodack, LLP

(57) ABSTRACT

A semiconductor device structure and a formation method are provided. The method includes forming a fin structure over a substrate. The fin structure has multiple sacrificial layers and multiple semiconductor layers laid out in an alternating manner. The method also includes partially removing the fin structure to form a recess exposing side surfaces of the semiconductor layers and the sacrificial layers and forming multiple inner spacers covering the side surfaces of the sacrificial layers. The method further includes recessing the semiconductor layers from the side surfaces of the semiconductor layers after the inner spacers are formed and partially removing the inner spacers so that each of the inner spacers becomes thinner. In addition, the method includes forming an epitaxial structure on the side surfaces of the semiconductor layers.

20 Claims, 43 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 64/23*** | (2025.01) |
| ***H10D 64/27*** | (2025.01) |
| ***H10D 84/01*** | (2026.01) |
| ***H10D 84/83*** | (2025.01) |
| ***H10D 84/85*** | (2025.01) |

(52) U.S. Cl.
CPC ....... *H10D 64/518* (2025.01); *H10D 84/0167* (2025.01); *H10D 84/0184* (2025.01); *H10D 84/8311* (2025.01); *H10D 84/8316* (2025.01); *H10D 84/851* (2025.01); *H10D 30/6757* (2025.01)

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 11,855,215 | B2 * | 12/2023 | Liang | H01L 23/485 |
| 2018/0294331 | A1 * | 10/2018 | Cho | H10D 62/102 |
| 2020/0044061 | A1 * | 2/2020 | Cheng | H10D 62/021 |
| 2020/0052124 | A1 * | 2/2020 | Miao | H10D 64/017 |
| 2021/0028297 | A1 * | 1/2021 | Yao | H10D 30/6757 |
| 2021/0083074 | A1 * | 3/2021 | Yang | H10D 62/116 |
| 2021/0210598 | A1 * | 7/2021 | Cheng | H10D 62/115 |
| 2022/0131014 | A1 * | 4/2022 | Lai | H10D 30/6715 |
| 2022/0165881 | A1 * | 5/2022 | Min | H10D 30/0193 |
| 2022/0208967 | A1 * | 6/2022 | Ko | H10D 62/121 |
| 2022/0238723 | A1 * | 7/2022 | Jeong | H10D 64/018 |
| 2022/0271171 | A1 * | 8/2022 | Su | H10D 62/151 |
| 2022/0285533 | A1 * | 9/2022 | Lee | H10D 64/679 |
| 2022/0367622 | A1 * | 11/2022 | Lin | H10D 30/6713 |
| 2022/0367683 | A1 * | 11/2022 | Chen | H10B 10/125 |
| 2023/0063612 | A1 * | 3/2023 | Lin | H10D 30/031 |
| 2023/0317791 | A1 * | 10/2023 | Lin | H10D 62/121 257/401 |
| 2024/0421191 | A1 * | 12/2024 | Mochizuki | H10D 84/038 |
| 2025/0015132 | A1 * | 1/2025 | Hu | H10D 64/017 |

* cited by examiner

METHOD FOR FORMING A SEMICONDUCTOR DEVICE BY RECESSING SEMICONDUCTOR LAYERS AND INNER SPACERS

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
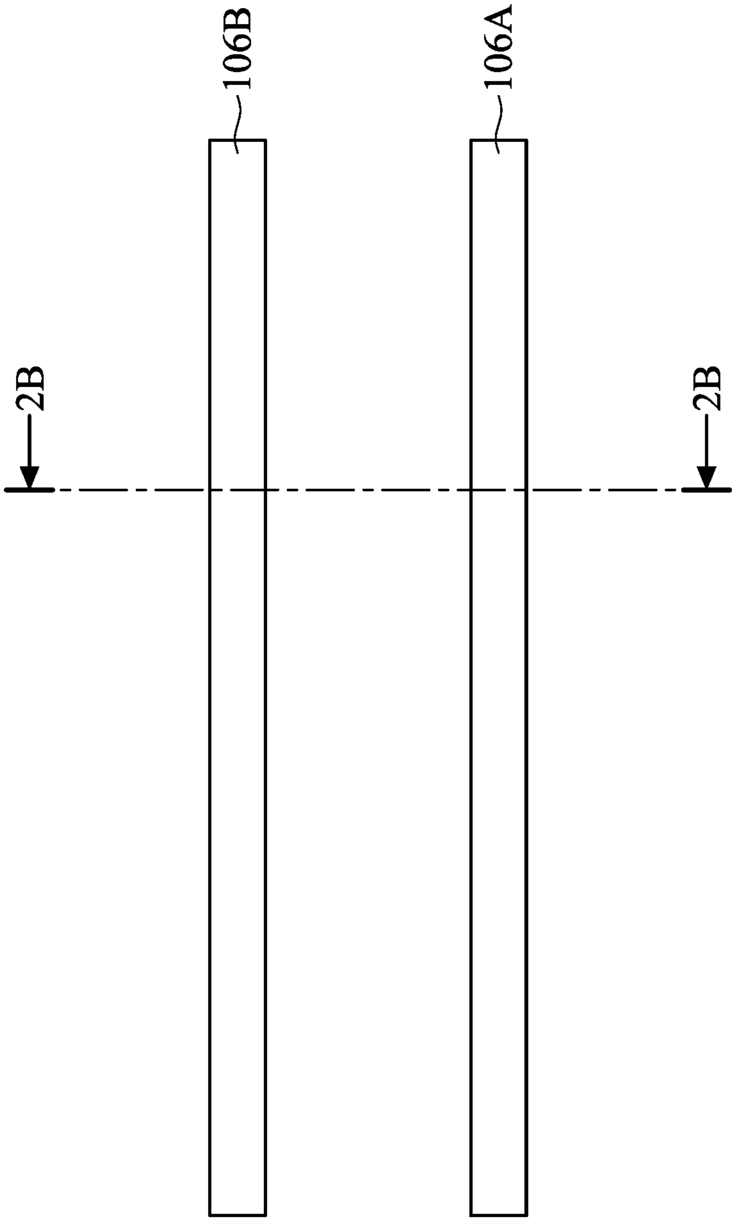
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100% of what is specified. Furthermore, terms such as "substantially parallel" or "substantially perpendicular" are to be interpreted as not to exclude insignificant deviation from the specified arrangement and may include for example deviations of up to 10 degrees in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% of what is specified in some embodiments. The term "about" in relation to a numerical value x may mean x ±5 or 10% of what is specified in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
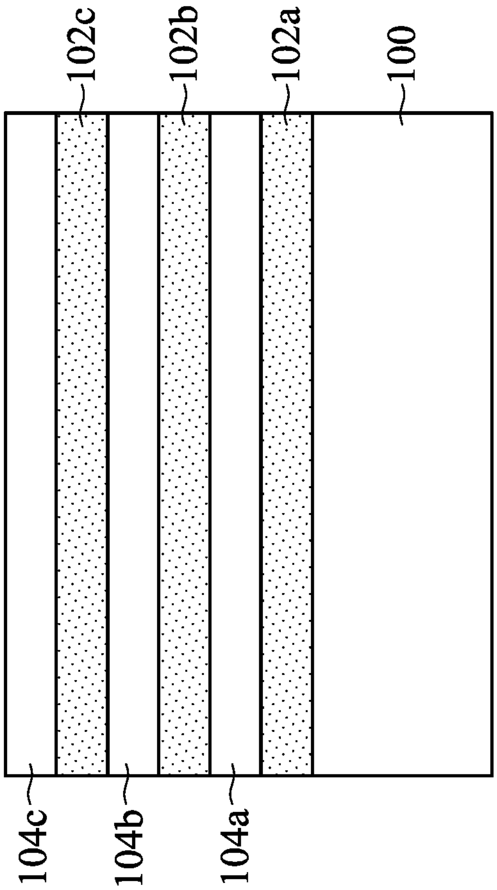
FIGS. 2A-2D are cross-sectional views of various stages of a process for forming a portion of a semiconductor device structure, in accordance with some embodiments.

FIGS. 2A-2D are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102*a*, 102*b*, and 102*c*. The semiconductor stack also includes multiple semiconductor layers 104*a*, 104*b*, and 104*c*. In some embodiments, the semiconductor layers 102*a*-102*c* and the semiconductor layers 104*a*-104*c* are laid out in an alternating manner, as shown in FIG. 2A.

In some embodiments, the semiconductor layers 102*a*-102*c* function as sacrificial layers that will be removed in a subsequent process to release the semiconductor layers 104*a*-104*c*. The semiconductor layers 104*a*-104*c* that are released may function as channel structures of one or more transistors.

In some embodiments, the semiconductor layers 104*a*-104*c* that will be used to form channel structures are made of a material that is different than that of the semiconductor layers 102*a*-102*c*. In some embodiments, the semiconductor layers 104*a*-104*c* are made of or include silicon, germanium, other suitable materials, or a combination thereof. In some embodiments, the semiconductor layers 102*a*-102*c* are made of or include silicon germanium. In some other embodiments, the semiconductor layers 104*a*-104*c* are made of silicon germanium, and the semiconductor layers 102*a*-102*c* are made of silicon germanium with different atomic concentration of germanium than that of the semiconductor layers 104*a*-104*c*. Due to the different compositions, different etching selectivity and/or different oxidation rates during subsequent processing may be achieved between the semiconductor layers 102*a*-102*c* and the semiconductor layers 104*a*-104*c*.

The present disclosure contemplates that the semiconductor layers 102*a*-102*c* and the semiconductor layers 104*a*-104*c* include any combination of semiconductor materials that can provide desired etching selectivity, desired oxidation rate differences, and/or desired performance characteristics (e.g., materials that maximize current flow).

In some embodiments, the semiconductor layers 102*a*-102*c* and 104*a*-104*c* are formed using multiple epitaxial growth operations. Each of the semiconductor layers 102*a*-102*c* and 104*a*-104*c* may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof.

In some embodiments, the semiconductor layers 102*a*-102*c* and 104*a*-104*c* are grown in-situ in the same process chamber. In some embodiments, the growth of the semiconductor layers 102_a_-102_c_ and 104_a_-104_c_ are alternately and sequentially performed in the same process chamber to complete the formation of the semiconductor stack. In some embodiments, the vacuum of the process chamber is not broken before the epitaxial growth of the semiconductor stack is accomplished.

Afterwards, hard mask elements are formed over the semiconductor stack to assist in a subsequent patterning of the semiconductor stack. Each of the hard mask elements may include a first mask layer 108 and a second mask layer 110. The first mask layer 108 and the second mask layer 110 may be made of different materials. One or more photolithography processes and one or more etching processes are used to pattern the semiconductor stack into multiple fin structures. The fin structures may be patterned by any suitable method. For example, the fin structures may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Figure 2B:
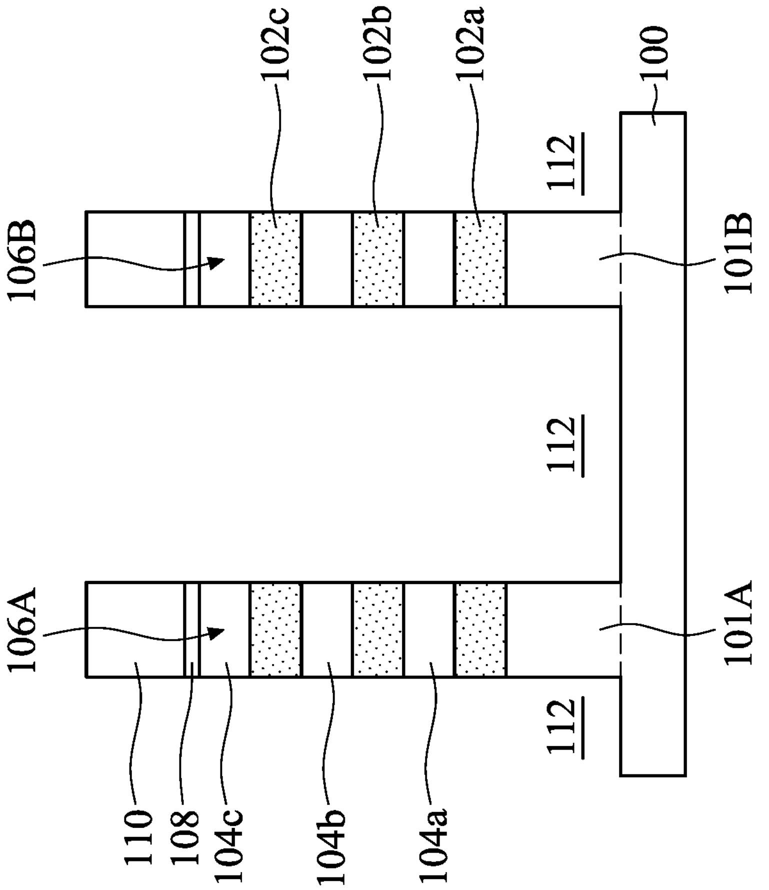

The semiconductor stack is partially removed to form multiple fin structures (including fin structures 106A and 106B) and multiple trenches 112, as shown in FIG. 2B. Each of the fin structures 106A-106B may include portions of the semiconductor layers 102_a_-102_c_ and 104_a_-104_c_ and multiple semiconductor fins (including semiconductor fins 101A and 101B), as shown in FIG. 2B. The semiconductor substrate 100 may also be partially removed during the etching process that forms the fin structures. Protruding portions of the semiconductor substrate 100 that remain form the semiconductor fins 101A and 101B.

Figure 1B:
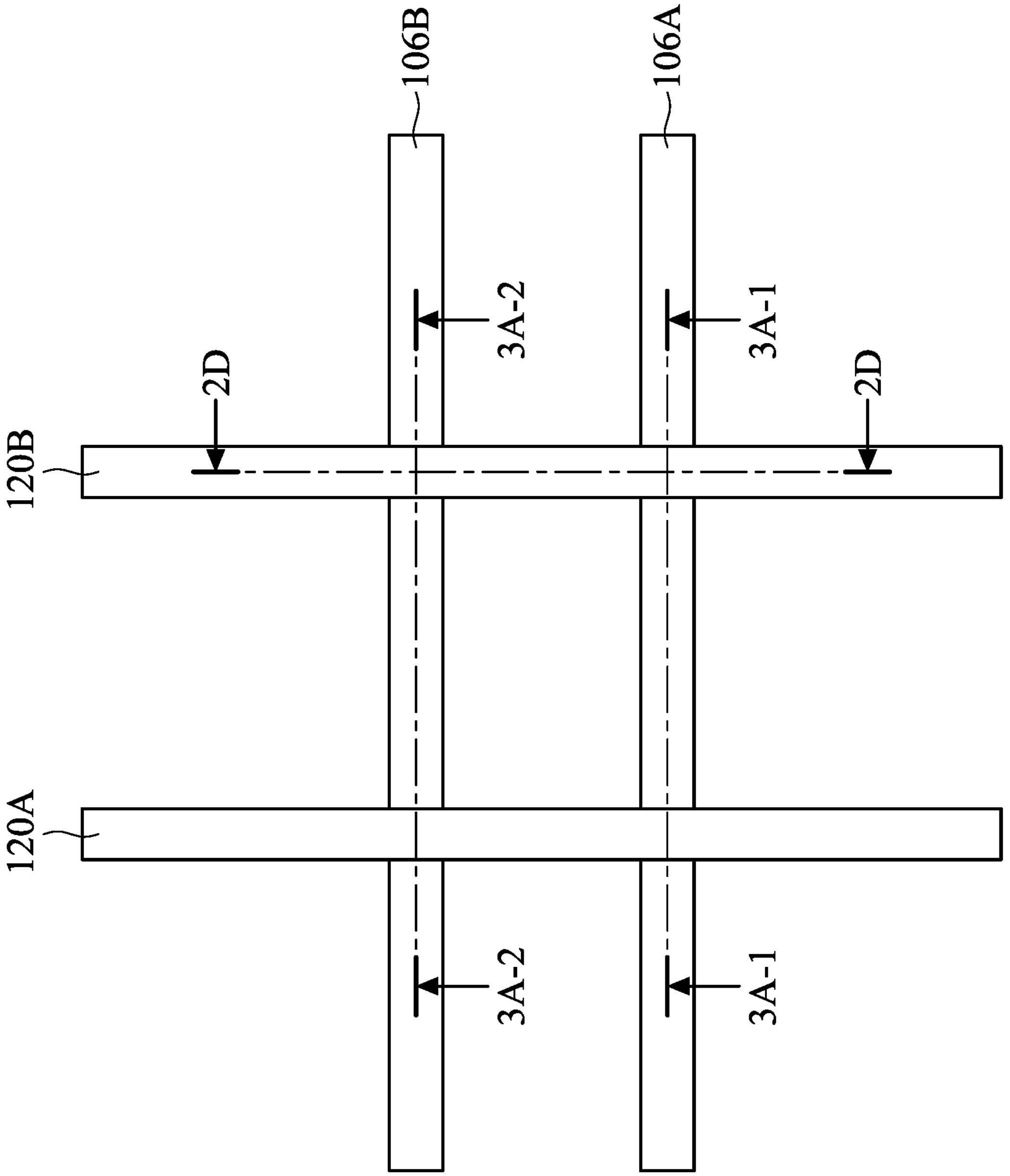

FIGS. 1A-1B are top views of various stages of a process for forming a portion of a semiconductor device structure, in accordance with some embodiments. As shown in FIG. 1A, multiple fin structures 106A and 106B are formed, in accordance with some embodiments. In some embodiments, the fin structures 106A and 106B are oriented lengthwise. In some embodiments, the extending directions of the fin structures 106A and 106B are substantially parallel to each other, as shown in FIG. 1A. In some embodiments, FIG. 2B is a cross-sectional view of the structure taken along the line 2B-2B in FIG. 1A.

Figure 2C:
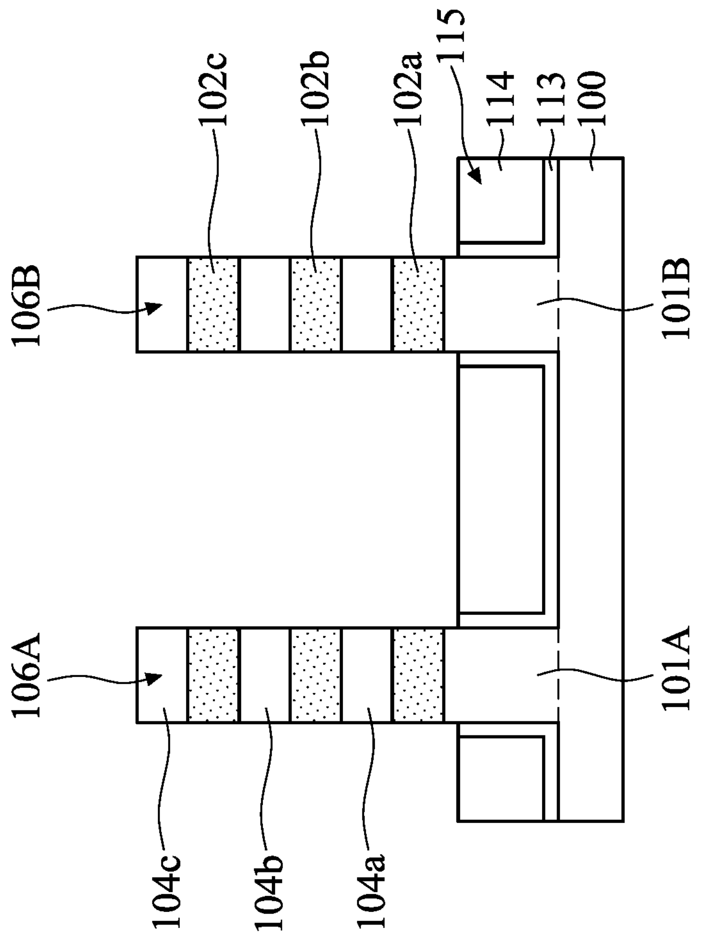

Afterwards, as shown in FIG. 2C, an isolation structure 115 is formed to surround lower portions of the fin structures 106A and 106B, in accordance with some embodiments. In some embodiments, the isolation structure 115 includes dielectric fillings 114 and a liner layer 113 that is adjacent to the semiconductor fins 101A and 101B.

In some embodiments, one or more dielectric layers for forming the dielectric fillings 114 are deposited over the fin structures 106A and 106B and the semiconductor substrate 100. The dielectric layers may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The liner layer 113 may be made of or include silicon nitride, silicon oxynitride, silicon carbide, silicon oxycarbide, one or more other suitable materials, or a combination thereof. The dielectric layers and the liner layer 113 may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers and the liner layer 113. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof.

Afterwards, one or more etching back processes are used to partially remove the dielectric layers and the liner layer 113. As a result, the remaining portion of the dielectric layers forms the dielectric fillings 114 of the isolation structure 115. Upper portions of the fin structures 106A and 106B protrude from the top surface of the isolation structure 115, as shown in FIG. 2C.

In some embodiments, the etching back process for forming the isolation structure 115 is carefully controlled to ensure that the topmost surface of the isolation structure 115 is positioned at a suitable height level, as shown in FIG. 2C. In some embodiments, the topmost surface of the isolation structure 115 is below the bottommost surface of the semiconductor layer 102_a_ that functions as a sacrificial layer.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 115.

Figure 2D:
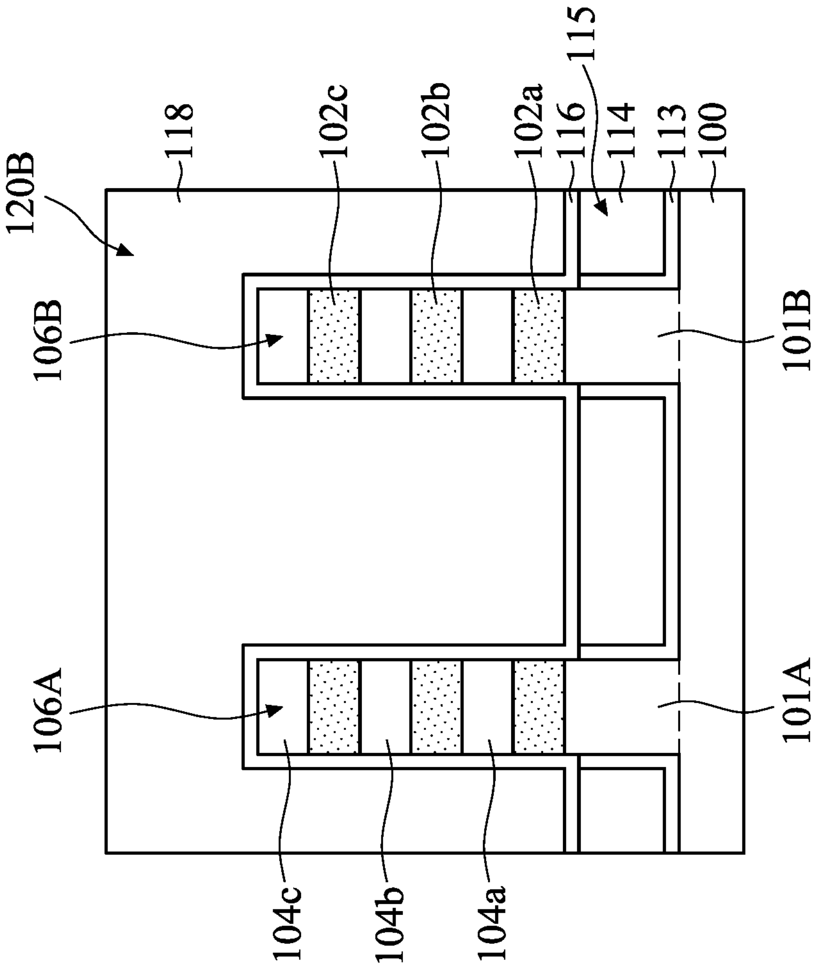
Figure 3A:
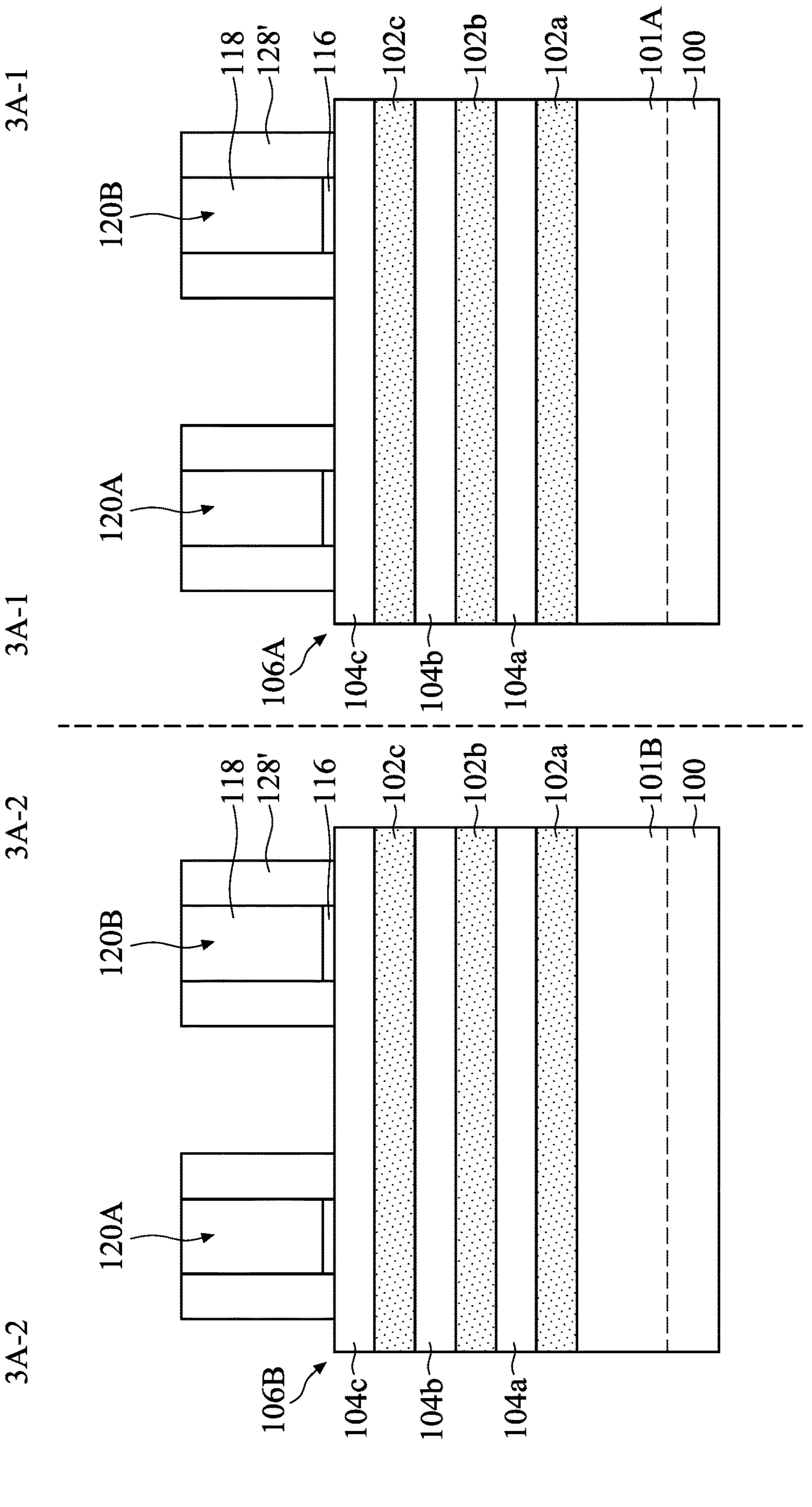
FIGS. 3A-3O are cross-sectional views of various stages of a process for forming portions of a semiconductor device structure, in accordance with some embodiments.

Afterwards, dummy gate stacks 120A and 120B are formed to extend across the fin structures 106A and 106B, as shown in FIG. 1B in accordance with some embodiments. In some embodiments, FIG. 2D is a cross-sectional view of the structure taken along the line 2D-2D in FIG. 1B. FIGS. 3A-3O are cross-sectional views of various stages of a process for forming portions of a semiconductor device structure, in accordance with some embodiments. In some embodiments, FIG. 3A is a cross-sectional view of two portions of the structure taken along the lines 3A-1 to 3A-1 and 3A-2 to 3A-2 in FIG. 1B.

As shown in FIGS. 1B, 2D, and 3A, the dummy gate stacks 120A and 120B partially cover and extend across the fin structures 106A and 106B, in accordance with some embodiments. In some embodiments, the dummy gate stacks 120A and 120B wraps around the fin structures 106A and 106B. As shown in FIG. 2D, the dummy gate stack 120B extends across and is wrapped around the fin structures 106A and 106B. As shown in FIG. 1B, other portions of the fin structures 106A and 106B are exposed without being covered by the dummy gate stack 120A or 120B.

As shown in FIGS. 2D and 3A, each of the dummy gate stacks 120A and 120B includes a dummy gate dielectric layer 116 and a dummy gate electrode 118. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106A and 106B. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B.

As shown in FIG. 3A, gate spacers 128' are then formed over the sidewalls of the dummy gate stacks 120A and 120B, in accordance with some embodiments. In some embodiments, one or more spacer layers are deposited over the dummy gate stacks 120A and 120B and the fin structures 106A and 106B. The spacer layers extend along the tops and sidewalls of the dummy gate stacks 120A and 120B.

The spacer layers may be made of or include silicon nitride, silicon oxynitride, carbon-containing silicon nitride, carbon-containing silicon oxynitride, silicon oxide, carbon-containing silicon oxide, aluminum oxide, hafnium oxide, one or more other suitable materials, or a combination thereof. In some embodiments, one or more of the spacer layers is/are made of a high-k material. The dielectric constant of the high-k material may be greater than about 7. The spacer layers may be deposited using a CVD process, an ALD process, a physical vapor deposition (PVD) process, another applicable process, or a combination thereof.

Afterwards, the spacer layers are partially removed, in accordance with some embodiments. One or more anisotropic etching processes may be used to partially remove the spacer layers. As a result, remaining portions of the spacer layers form the gate spacers 128'. The gate spacers 128' extend along the sidewalls of the dummy gate stacks 120A and 120B, as shown in FIG. 3A.

Figure 3B:
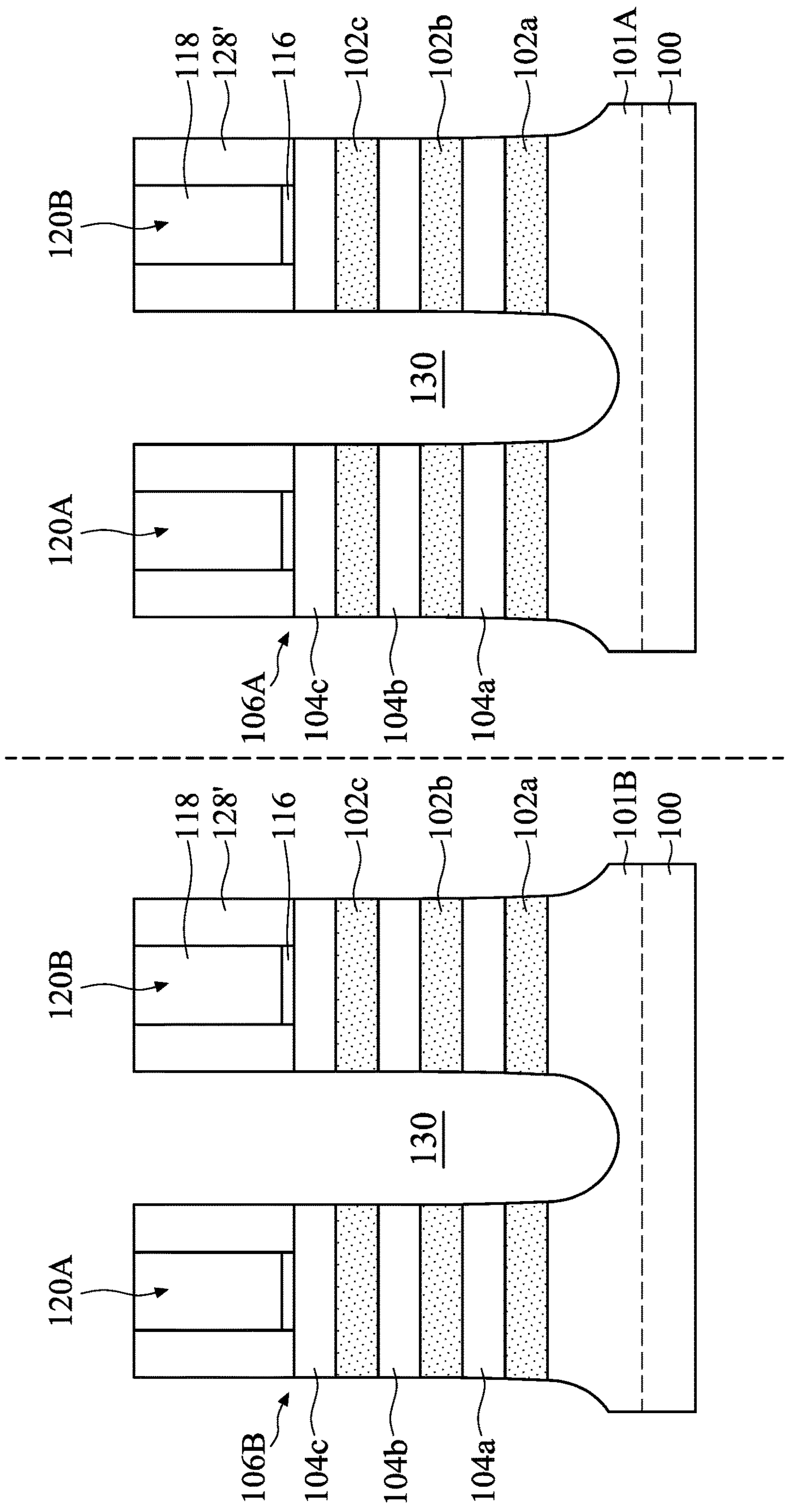

As shown in FIG. 3B, the fin structures 106A and 106B are partially removed, in accordance with some embodiments. As a result, multiple recesses 130 are formed. The recesses 130 may be used to contain epitaxial structures (such as source/drain structures) that will be formed later. Source/drain structures (or region(s)) may refer to a source or a drain, individually or collectively dependent upon the context. In some embodiments, the recesses 130 formed in the fin structure 106A are used for containing p-type doped epitaxial structures that will be formed later. In some embodiments, the recesses 130 formed in the fin structure 106B are used for containing n-type doped epitaxial structures that will be formed later.

One or more etching processes may be used to form the recesses 130. In some embodiments, a dry etching process is used to form the recesses 130. Alternatively, a wet etching process may be used to form the recesses 130. The recesses 130 penetrate into the fin structures 106A and 106B. In some embodiments, the recesses 130 further extend into the semiconductor fins 101A and 101B, as shown in FIG. 3B.

In some embodiments, the recesses 130 have substantially vertical sidewalls. In these cases, due to the profile of the recesses 130, an upper semiconductor layer (such as the semiconductor layer 104*c*) is substantially as wide as a lower semiconductor layer (such as the semiconductor layer 104*b*).

However, embodiments of the disclosure have many variations. In some other embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104*c*) is shorter than a lower semiconductor layer (such as the semiconductor layer 104*b*).

Figure 3C:
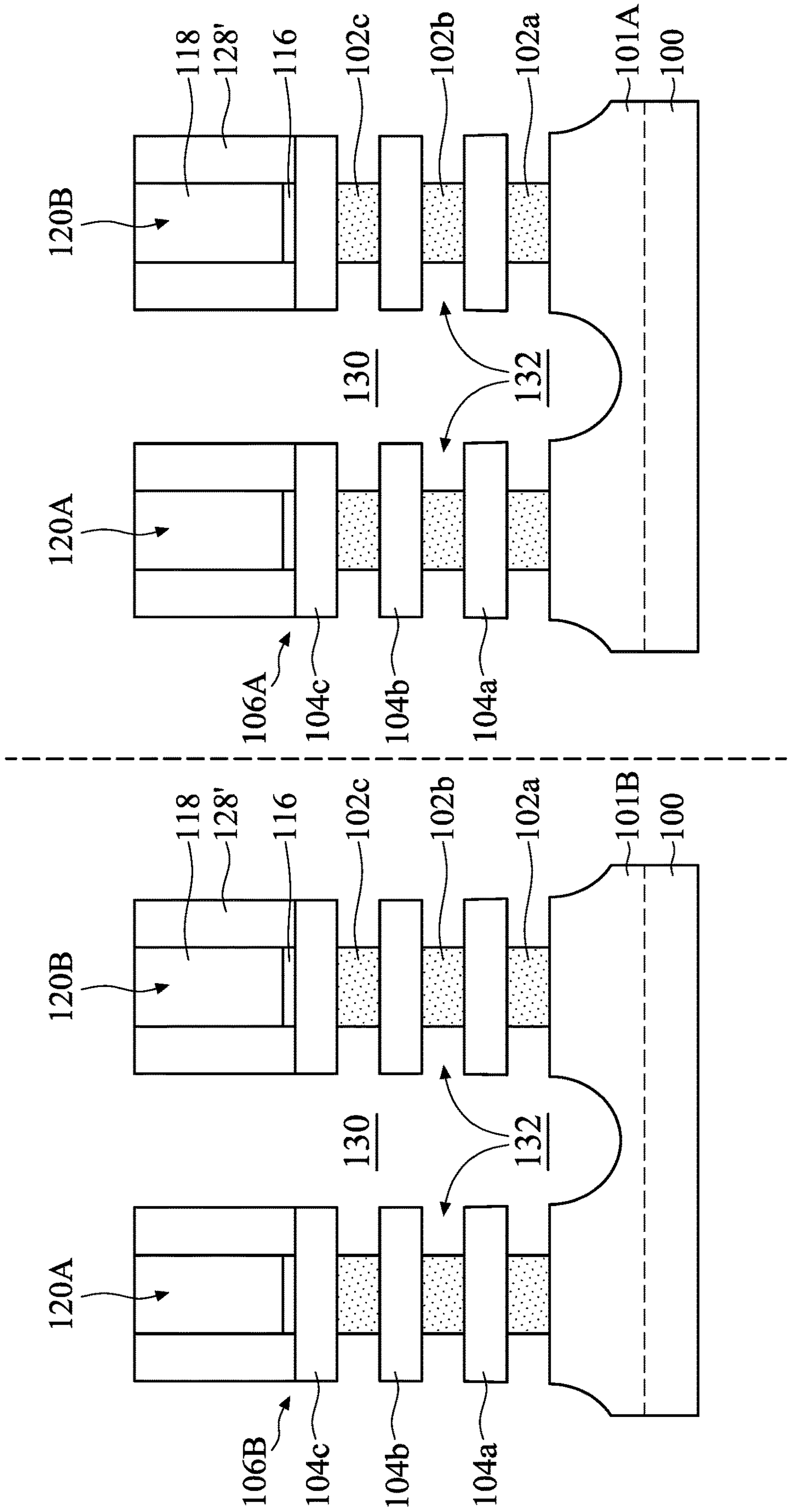

Afterwards, as shown in FIG. 3C, the semiconductor layers 102*a*-102*c* are laterally etched, in accordance with some embodiments. As a result, edges of the semiconductor layers 102*a*-102*c* retreat from edges of the semiconductor layers 104*a*-104*c*. As shown in FIG. 3C, recesses 132 are formed due to the lateral etching of the semiconductor layers 102*a*-102*c*. The recesses 132 may be used to contain inner spacers that will be formed later. The semiconductor layers 102*a*-102*c* may be laterally etched using a wet etching process, a dry etching process, or a combination thereof. In some other embodiments, the semiconductor layers 102*a*-102*c* are partially oxidized before being laterally etched.

Figure 3D:
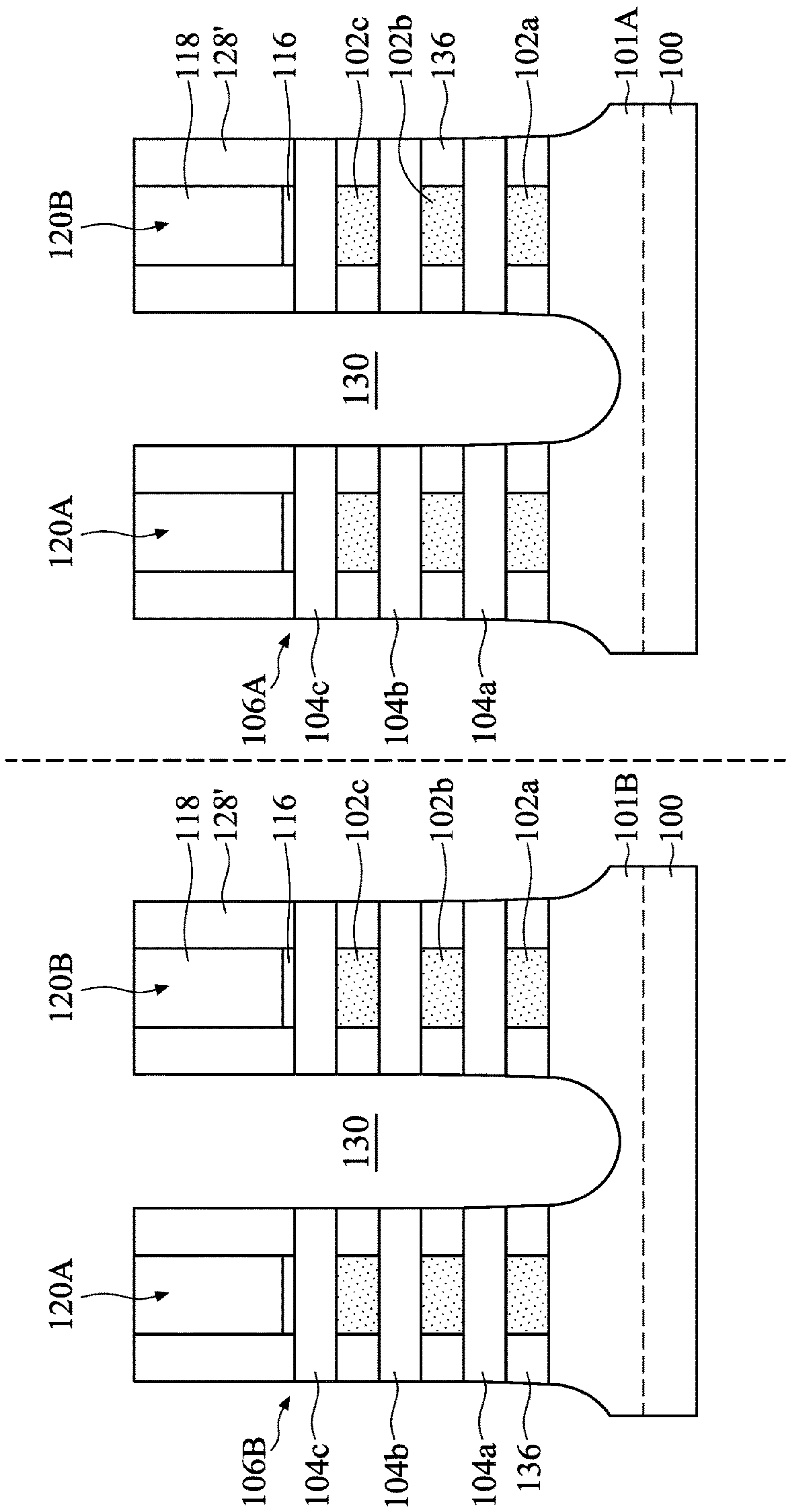

As shown in FIG. 3D, inner spacers 136 are formed on the recesses 132, in accordance with some embodiments. The inner spacers 136 cover the edges of the semiconductor layers 102*a*-102*c*. The inner spacers 136 may be used to prevent subsequently formed epitaxial structures (which function as, for example, source/drain structures) from being damaged during a subsequent process for removing the semiconductor layers 102*a*-102*c*. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, an insulating layer is deposited over the structure shown in FIG. 3C, in accordance with some embodiments. The insulating layer covers the dummy gate stacks 120A and 120B and fills the recesses 132. The insulating layer may be made of or include carbon-containing silicon nitride (SiCN), carbon-containing silicon oxynitride (SiOCN), carbon-containing silicon oxide (SiOC), silicon oxide, silicon nitride, aluminum oxide, hafnium oxide, one or more other suitable materials, or a combination thereof. In some embodiments, the insulating layer is a single layer. In some other embodiments, the insulating layer includes multiple sub-layers. Some of the sub-layers may be made of different materials and/or contain different compositions. The insulating layer may be deposited using a CVD process, an ALD process, one or more other applicable processes, or a combination thereof.

Afterwards, one or more etching processes are used to partially remove the insulating layer, in accordance with some embodiments. The portions of the insulating layer outside of the recesses 132 may be removed. The remaining portions of the insulating layer form the inner spacers 136, as shown in FIG. 3D. The etching process may include a dry etching process, a wet etching process, or a combination thereof. In some embodiments, the compositions of the inner spacers 136 and the gate spacers 128' are different, so as to provide etching selectivity between the inner spacers 136 and the gate spacers 128'.

In some embodiments, after the etching process for forming the inner spacers 136, portions of the semiconductor fins 101A and 101B originally covered by the insulating layer are exposed by the recesses 130, as shown in FIG. 3D. The edges of the semiconductor layers 104*a*-104*c* are exposed by the recesses 130, as shown in FIG. 3D.

Figure 3E:
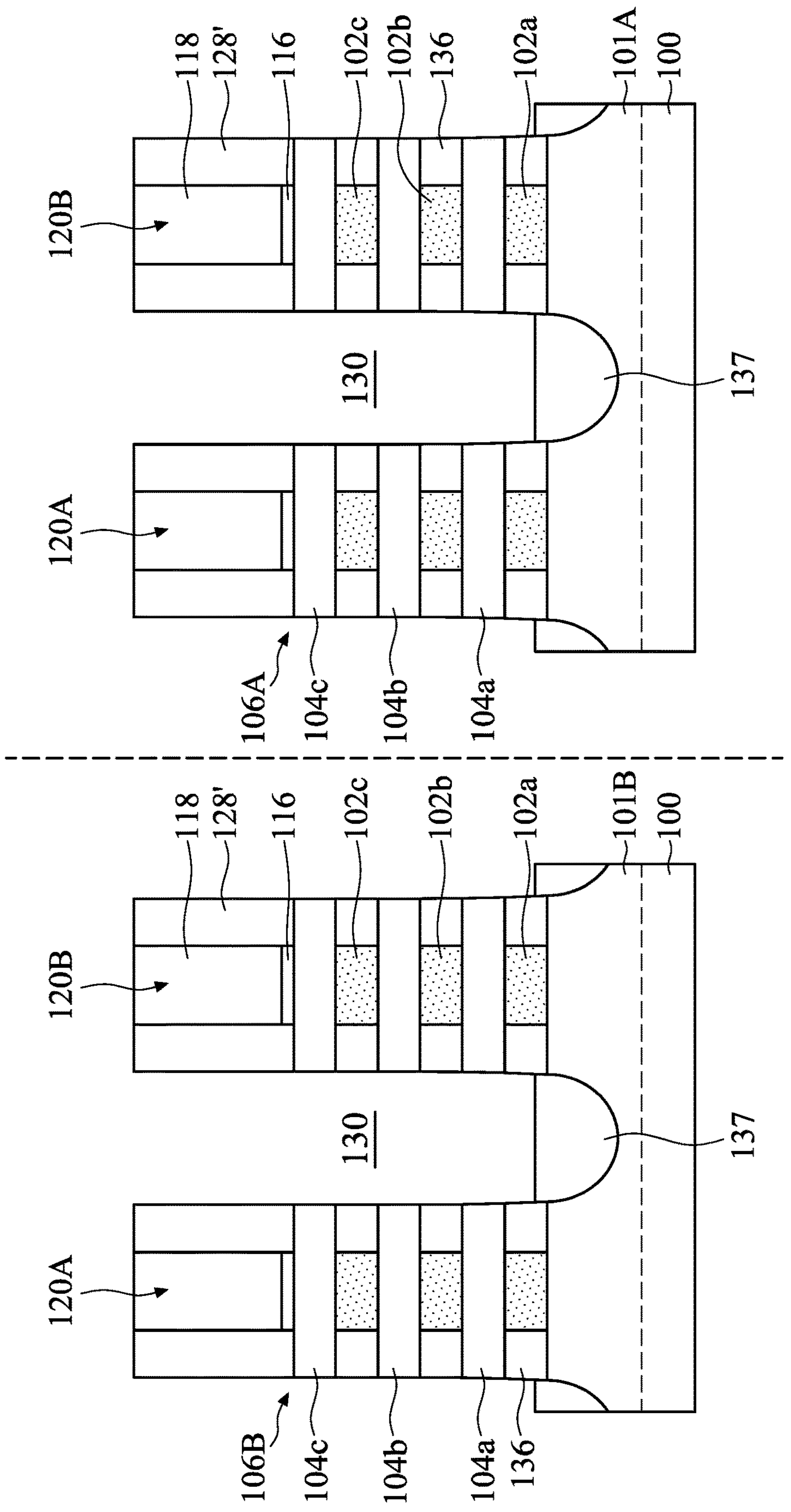

As shown in FIG. 3E, semiconductor isolation structures 137 are formed over the bottoms of the recesses 130, in accordance with some embodiments. In some embodiments, the semiconductor isolation structures 137 are epitaxial structures that are undoped. In some embodiments, the semiconductor isolation structures 137 are substantially free of n-type dopants or p-type dopants.

The semiconductor isolation structures 137 may be made of or include silicon, silicon germanium, another suitable material, or a combination thereof. The semiconductor isolation structures 137 may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, another applicable process, or a combination thereof. In some embodiments, the formation of the semiconductor isolation structures 137 involve one or more etching processes that are used to fine-tune the profiles of the semiconductor isolation structures 137. In some embodiments, the semiconductor isolation structures 137 on the semiconductor fins 101A and 101B are formed simultaneously.

In some embodiments, the semiconductor isolation structures 137 are formed to have substantially planar top surfaces, as shown in FIG. 3E. In some embodiments, the top surfaces of the semiconductor isolation structures 137 are positioned at a height level that is lower than the bottom surface of the semiconductor layer 104*a*. In some embodiments, the top surfaces of the semiconductor isolation structures 137 and the top surfaces of the semiconductor fins 101A and 101B are substantially level. In some embodiments, the top surfaces of the semiconductor isolation structures 137 are higher than the top surfaces of the semiconductor fins 101A and 101B. In some embodiments, the semiconductor isolation structures 137 are in direct contact with some of the inner spacers 136, as shown in FIG. 3E.

Figure 3F:
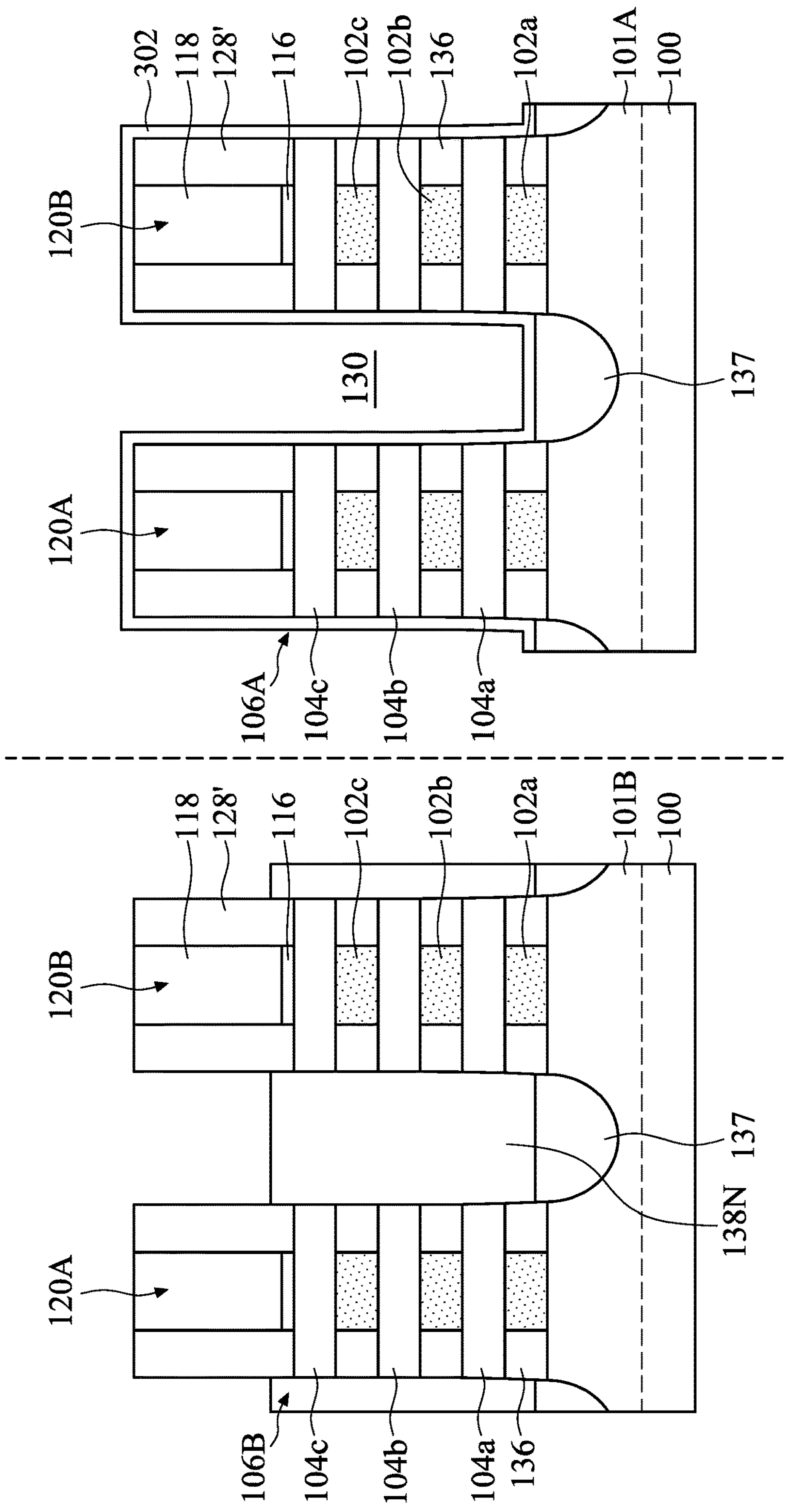

As shown in FIG. 3F, a mask element 302 is formed to cover the fin structure 106A, the semiconductor isolation structures 137 on the semiconductor fin 101A, and portions of the dummy gate stacks 120A and 120B near the fin structure 106A, in accordance with some embodiments. The fin structure 106B, the semiconductor isolation structures 137 on the semiconductor fin 101B, and portions of the dummy gate stacks 120A and 120B near the fin structure 106B are exposed without being covered by the mask element 302.

In some embodiments, a mask element layer is formed over the structure shown in FIG. 3E. Afterwards, a patterned photoresist layer is formed over the mask element layer. With the patterned photoresist layer as an etching mask, an etching process is used to partially remove the mask element. As a result, the remaining portion of the mask element under the patterned photoresist layer forms the mask element 302. Then, the patterned photoresist layer is removed.

Afterwards, epitaxial structures 138N are formed on the side surfaces of semiconductor layers 104*a*-104*c* and the semiconductor fin 101B that are not covered by the mask element 302, in accordance with some embodiments. In some embodiments, the epitaxial structures 138N fill the recesses 130 that are not covered by the mask element 302, as shown in FIG. 3F. In some embodiments, the epitaxial structures 138N overfill the recesses 130 to ensure fully contact between the epitaxial structures 138N and the side surfaces of the semiconductor layer 104*c* nearby. In some embodiments, the top surfaces of the epitaxial structures 138N are higher than the top surface of the dummy gate dielectric layer 116. In some other embodiments, the epitaxial structures 138N partially fill the recesses 130.

In some embodiments, the epitaxial structures 138N connect to some of the semiconductor layers 104*a*-104*c*. Some of the semiconductor layers 104*a*-104*c* are sandwiched between the epitaxial structures 138N. In some embodiments, the epitaxial structures 138N are n-type doped epitaxial structures. The epitaxial structures 138N may include epitaxially grown silicon, epitaxially grown silicon germanium (SiGe), or another suitable epitaxially grown semiconductor material.

In some embodiments, the epitaxial structures 138N are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138N involves one or more etching processes that are used to fine-tune the shapes of the epitaxial structures 138N.

In some embodiments, the epitaxial structures 138N are doped with one or more suitable n-type dopants. For example, the epitaxial structures 138N are Si source/drain features that are doped with phosphor (P), antimony (Sb), arsenic (As) or another suitable dopant. In some embodiments, each of the epitaxial structures 138N has a first region and a second region over the first region. The second region may have a greater dopant concentration than that of the first region.

In some embodiments, the epitaxial structures 138N are doped in-situ during their epitaxial growth. The initial reaction gas mixture for forming the epitaxial structures 138N contains dopants. In some other embodiments, the epitaxial structures 138N are not doped during the growth of the epitaxial structures 138N. Instead, after the formation of the epitaxial structures 138N, the epitaxial structures 138N are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138N are further exposed to one or more annealing processes to activate the dopants. For example, a rapid thermal annealing process is used.

Figure 3G:
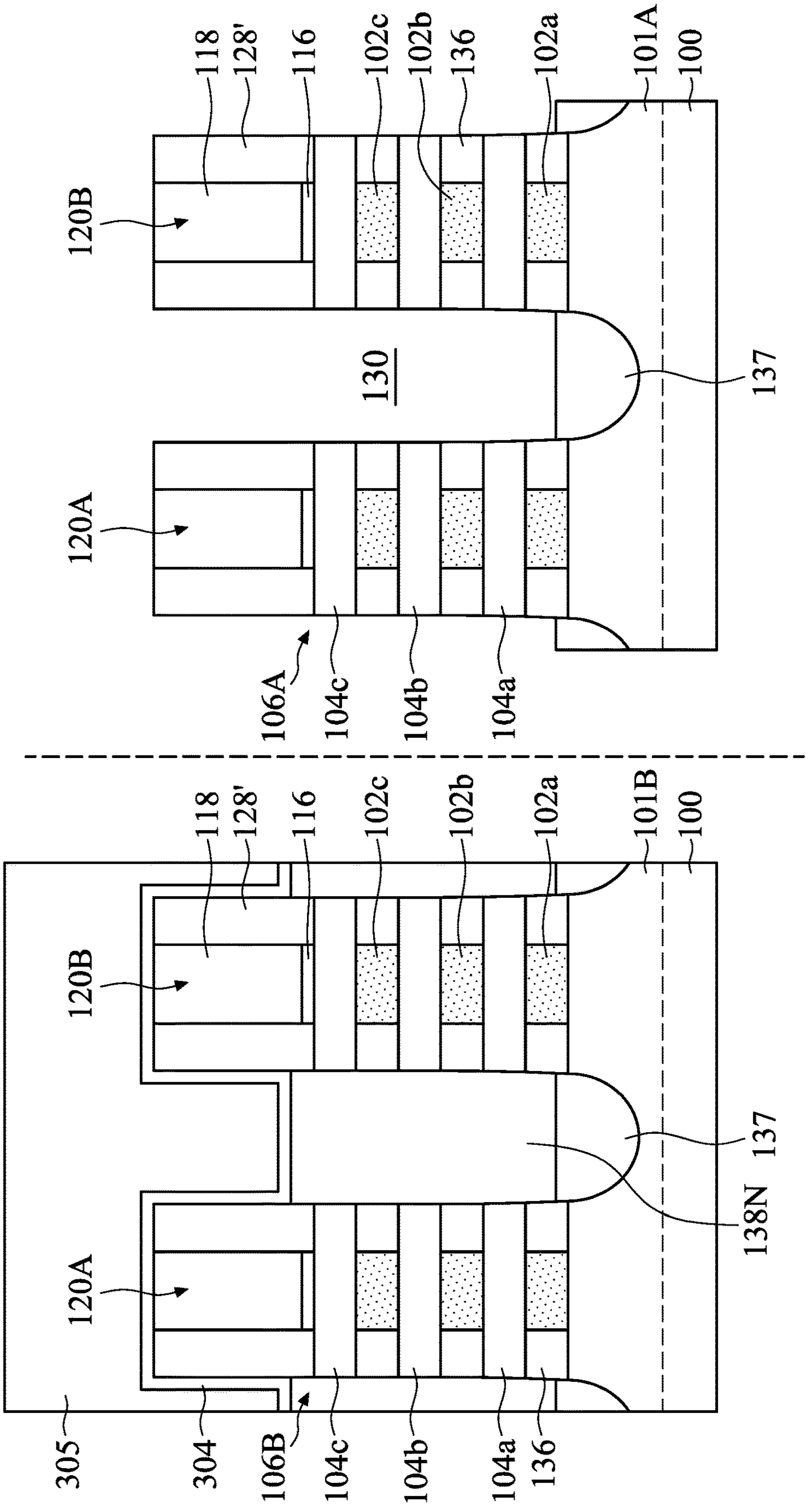

As shown in FIG. 3G, the mask element 302 is removed, and a mask element 304 is formed to cover the epitaxial structures 138N, in accordance with some embodiments. A pattern photoresist layer 305 is formed to assist in the formation of the mask element 304. After the removal of the mask element 302, the fin structure 106A and the semiconductor isolation structures 137 on the semiconductor fin 101A are exposed.

Figure 3H:
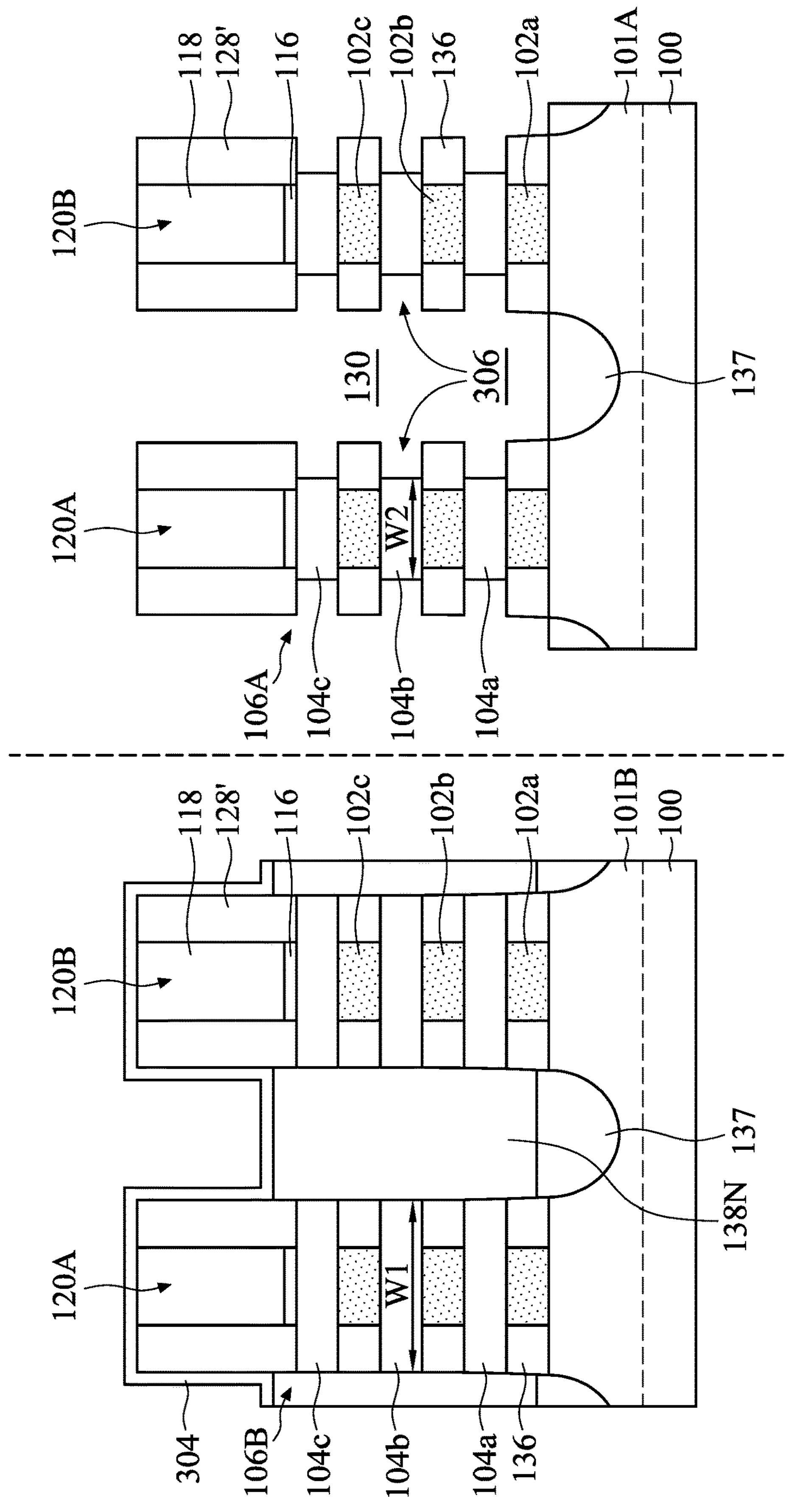

As shown in FIG. 3H, the patterned photoresist layer 305 is removed, in accordance with some embodiments. The epitaxial structures 138N and the portions of the dummy gate stacks 120A and 120B and the gate spacers 128' nearby remain covered by the mask element 304.

Afterwards, the semiconductor layers 104*a*-104*c* of the fin structure 106A are recessed, as shown in FIG. 3H in accordance with some embodiments. In some embodiments, the semiconductor layers 104*a*-104*c* are laterally etched from the exposed side surfaces of the semiconductor layers 104*a*-104*c*. As a result, edges of the semiconductor layers 104*a*-104*c* retreat from edges of the inner spacers 136.

In some embodiments, recesses 306 are formed due to the lateral etching of the semiconductor layers 104*a*-104*c*, as shown in FIG. 3H. The semiconductor layers 104*a*-104*c* may be laterally etched using a wet etching process, a dry etching process, or a combination thereof. In some other embodiments, the semiconductor layers 104*a*-104*c* are partially oxidized before being laterally etched.

As shown in FIG. 3H, the semiconductor layers 104*a*-104*c* of the fin structure 106B have a width W1, and the semiconductor layers 104*a*-104*c* of the fin structure 106A have a width W2. The width W1 is wider than the width W2. The semiconductor layers 104*a*-104*c* of the fin structure 106B are prevented from being laterally etched since they are covered by the epitaxial structures 138N and the mask element 304. Therefore, each of the semiconductor layers 104*a*-104*c* of the fin structure 106B is wider than each of the semiconductor layers 104*a*-104*c* of the fin structure 106A. The semiconductor layers 104*a*-104*c* with the width W2 may be formed into channel structures of a PMOS transistor in subsequent processes. The channel structures that is shorter may provide lower channel resistance. The performance may thus be improved.

In some embodiments, the semiconductor isolation structures 137 formed on the semiconductor fin 101A are also partially removed during the lateral etching of the semiconductor layers 104*a*-104*c*. In some embodiments, the top surfaces of the semiconductor isolation structures 137 on the semiconductor fin 101A are substantially level with the top surface of the semiconductor fin 101A, as shown in FIG. 3K. In some embodiments, the top surfaces of the semiconductor isolation structures 137 on the semiconductor fin 101B slightly protrude from the top surface of the semiconductor fin 101B, as shown in FIG. 3K.

Figure 3I:
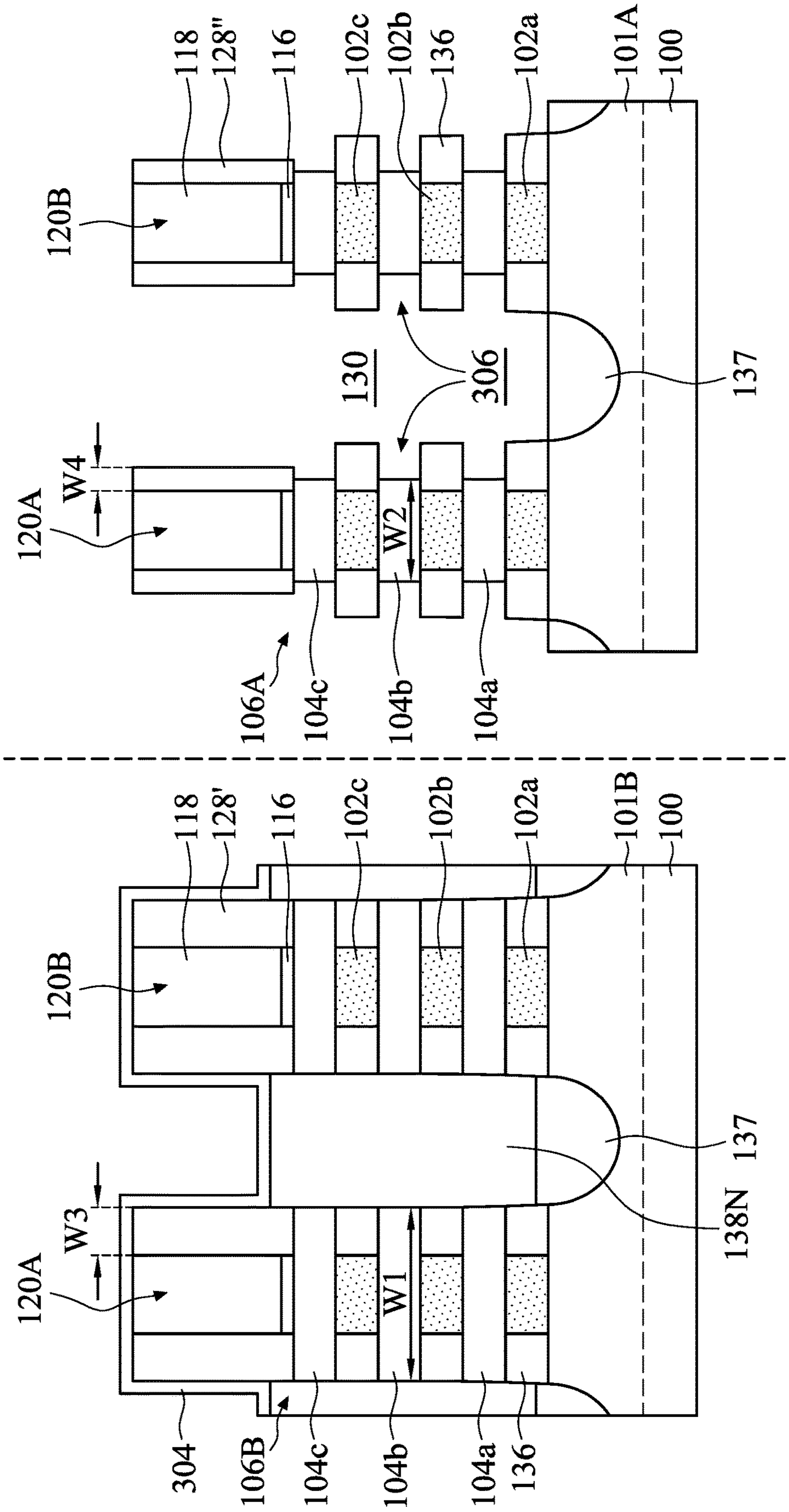

As shown in FIG. 3I, the exposed portions of the gate spacers 128' are partially removed to form trimmed gate spacers 128", in accordance with some embodiments. One or more etching processes may be used to trim the exposed portions of the gate spacers 128' into the trimmed gate spacers 128". The portions of the gate spacers 128' under the mask element 304 are prevented from being trimmed.

Each of the gate spacers 128' has a wider portion with a width W3 and a narrower portion (i.e., the trimmed gate spacer 128") with a width W4, as shown in FIG. 3I. The width W3 may be within a range from about 4 nm to about 15 nm. The width W4 may be within a range from about 2 nm to about 13 nm. The ratio (W4/W3) of the width W4 to the width W3 may be within a range from about 30% to about 90%.

Figure 3J:
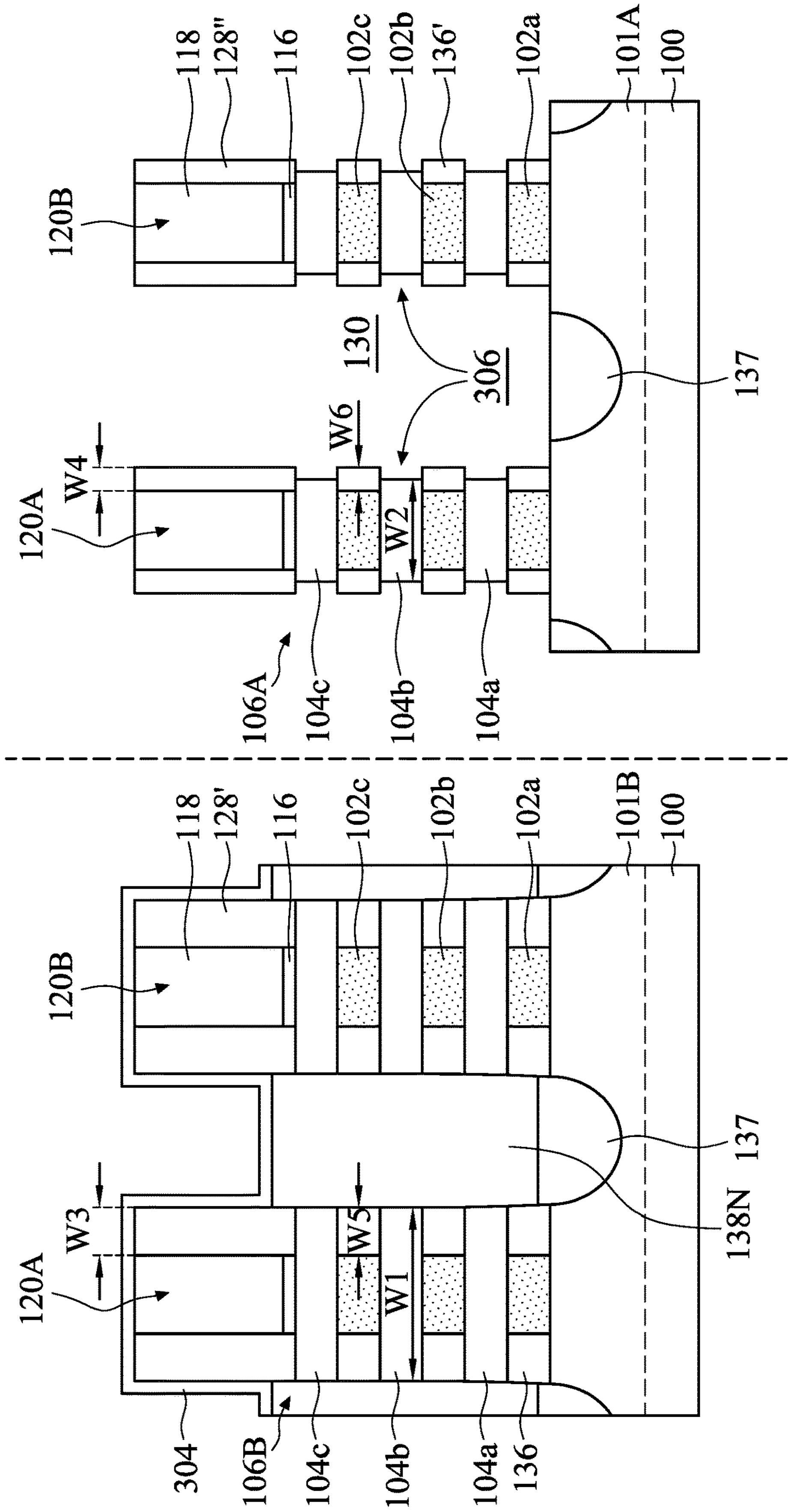
Figure 3K:
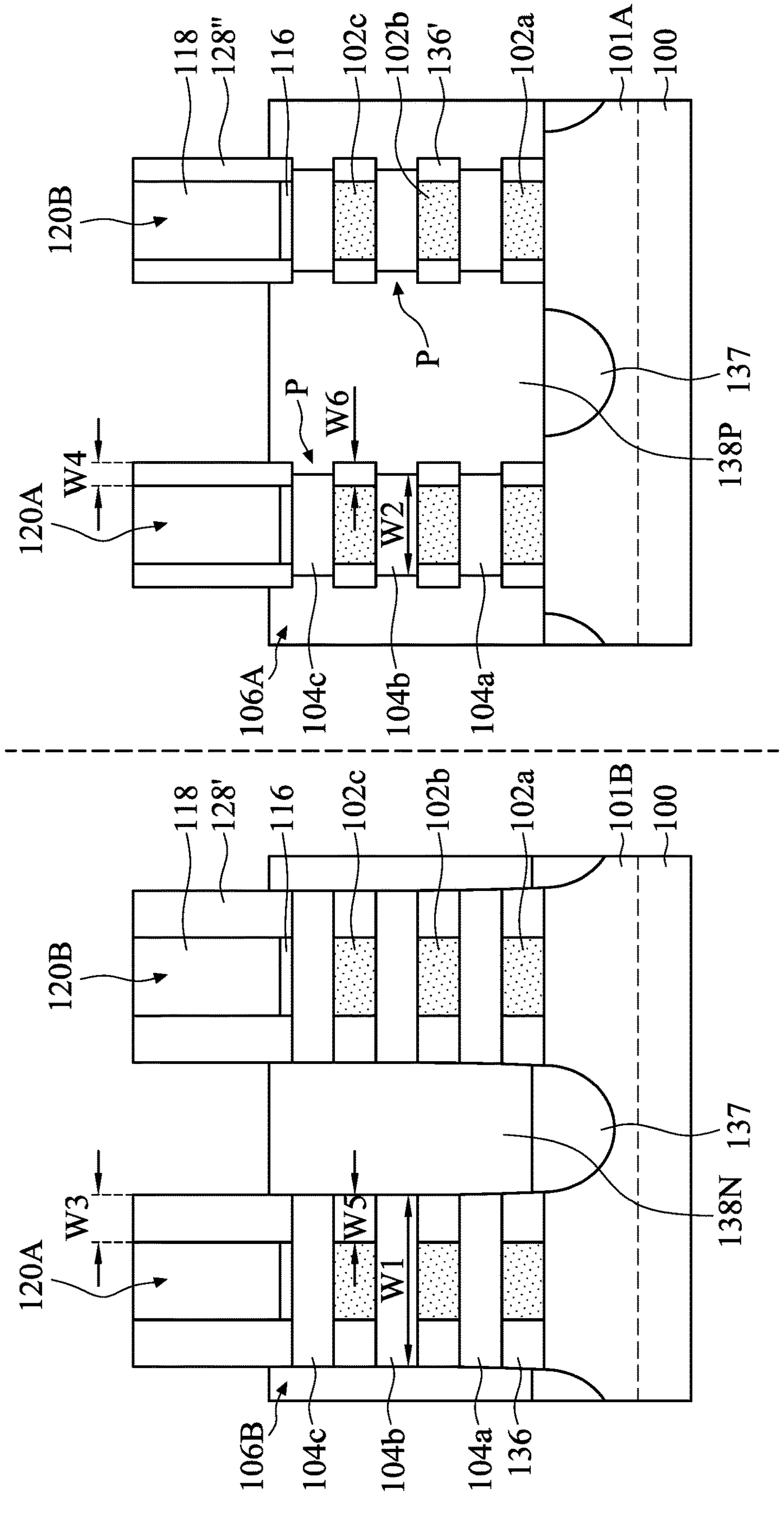

As shown in FIG. 3J, the inner spacers 136 covering the semiconductor layers 102*a*-102*c* of the fin structure 106A are partially removed to form trimmed inner spacers 136', in accordance with some embodiments. One or more etching processes may be used to trim the exposed inner spacers 136 into the trimmed inner spacers 136'. As a result, the trimmed inner spacers 136' become thinner than the inner spacers 136 that are not trimmed.

As shown in FIG. 3J, each of the inner spacers 136 has a width W5, and each of the trimmed inner spacers 136' has a width W6. The width W5 may be within a range from about 3 nm to about 15 nm. The width W6 may be within a range from about 1 nm to about 13 nm. The ratio (W6/W5) of the width W6 to the width W5 may be within a range from about 30% to about 90%.

In some embodiments, the isolation semiconductor structures 137 over the semiconductor fin 101A are spaced apart from the trimmed inner spacers 136', as shown in FIG. 3J. In some embodiments, the isolation semiconductor structures 137 over the semiconductor fin 101B are in direct contact with some of the inner spacers 136, as shown in FIG. 3J.

As shown in FIG. 3K, epitaxial structures 138P are formed on the semiconductor fin 101A and the semiconductor layers 104*a*-104*c*, in accordance with some embodiments. In some embodiments, the epitaxial structures 138P fill the recesses 130 that are not covered by the mask element 304. In some other embodiments, the epitaxial structures 138P overfill the recesses 130 to ensure fully contact between the epitaxial structures 138P and the side surfaces of the semiconductor layer 104*c* nearby. In some embodiments, the top surfaces of the epitaxial structures 138P are higher than the top surface of the dummy gate dielectric layer 116. In some other embodiments, the epitaxial structures 138P partially fill the recesses 130.

In some embodiments, the epitaxial structures 138P connect to some of the semiconductor layers 104*a*-104*c*. Some of the semiconductor layers 104*a*-104*c* are sandwiched between the epitaxial structures 138P. In some embodiments, the epitaxial structures 138P are p-type epitaxial structures. The epitaxial structures 138P may include epitaxially grown silicon germanium, epitaxially grown silicon, or another suitable epitaxially grown semiconductor material.

In some embodiments, the epitaxial structures 138P are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138P involves one or more etching processes that are used to fine-tune the shapes of the epitaxial structures 138P.

In some embodiments, the epitaxial structures 138P are doped with one or more suitable p-type dopants. For example, the epitaxial structures 138P are SiGe source/drain features or Si source/drain features that are doped with boron (B), gallium (Ga), indium (In), or another suitable dopant. In some embodiments, each of the epitaxial structures 138P has a first region and a second region over the first region. The second region may have a greater dopant concentration than that of the first region.

In some embodiments, the epitaxial structures 138P are doped in-situ during their epitaxial growth. The initial reaction gas mixture for forming the epitaxial structures 138P contains dopants. In some other embodiments, the epitaxial structures 138P are not doped during the growth of the epitaxial structures 138P. Instead, after the formation of the epitaxial structures 138P, the epitaxial structures 138P are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138P are further exposed to one or more annealing processes to activate the dopants. For example, a rapid thermal annealing process is used.

In some embodiments illustrated in FIGS. 3F-3K, the epitaxial structures 138N are formed before the epitaxial structures 138P. However, embodiments of the disclosure are not limited thereto. Many variations and/or modifications can be made to embodiments of the disclosure. In some other embodiments, the epitaxial structures 138P are formed before the epitaxial structures 138N.

Afterwards, the mask element 304 is removed, as shown in FIG. 3K in accordance with some embodiments. The epitaxial structures 138N and the portions of the dummy gate stacks 120A and 120B that are originally covered by the mask element 304 are thus exposed.

In some embodiments, each of the epitaxial structures 138P has multiple protruding portions extending towards the semiconductor layers 104*a*-104*c*, as shown in FIG. 3K. In some embodiments, the protruding portions P extend across the outer edges of the trimmed inner spacers 136' and the trimmed gate spacers 128". In some embodiments, the interface between the protruding portions P and one of the semiconductor layers 104*a*-104*c* is laterally between the opposite edges of the trimmed inner spacers 136'.

In some embodiments, due to the trimmed inner spacers 136' and the trimmed gate spacers 128", each of the protruding portions P is has a narrow width even if the semiconductor layers 104*a*-104*c* are laterally recessed. The resistance of the protruding portions P is thus kept at an acceptable level. The performance and reliability of the semiconductor device structure are ensured.

Figure 3L:
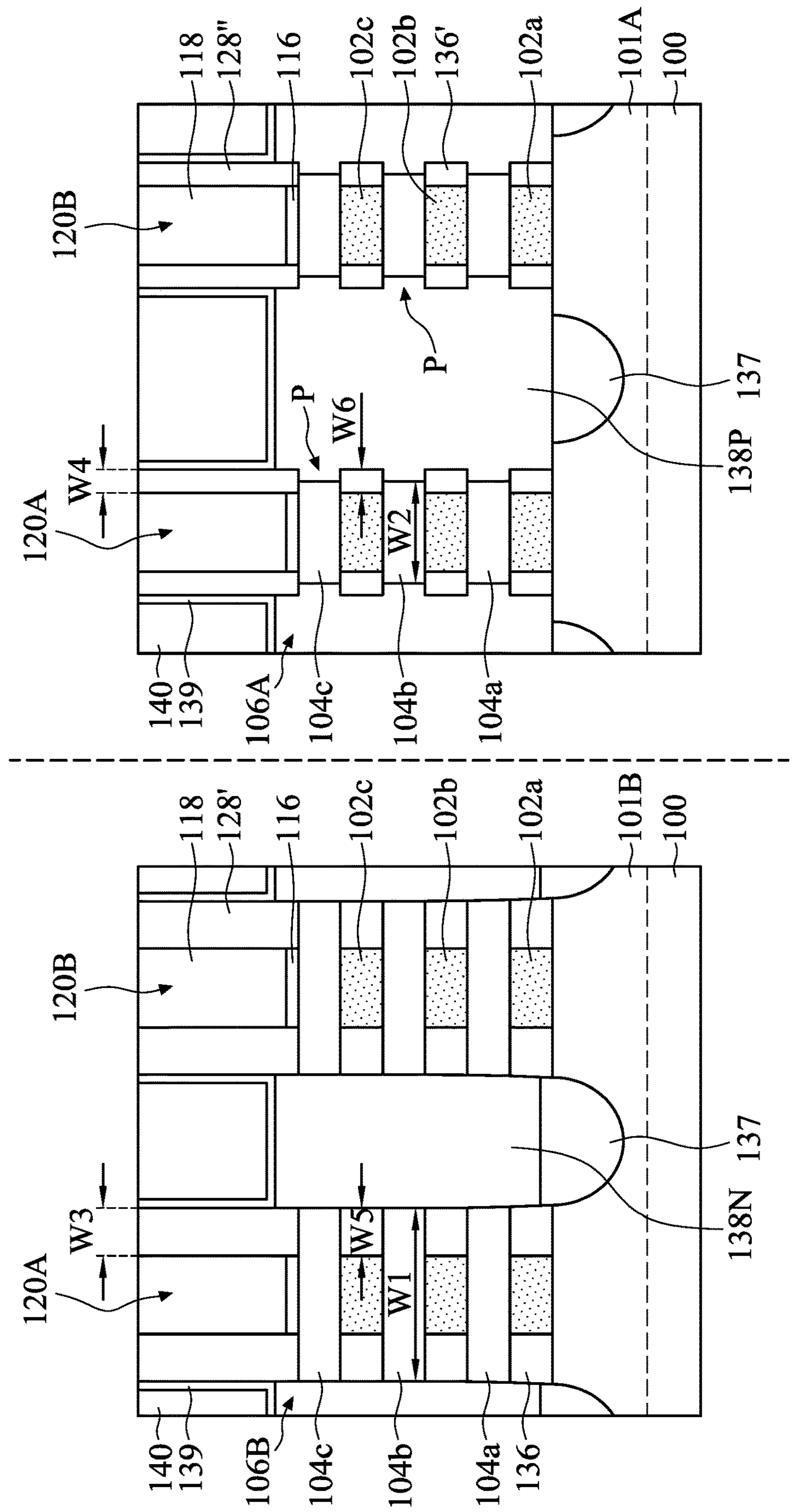

As shown in FIG. 3L, a contact etch stop layer 139 and a dielectric layer 140 are formed over the epitaxial structures 138N and 138P to laterally surround the dummy gate stacks 120A and 120B, in accordance with some embodiments. The contact etch stop layer 139 may be made of or include silicon nitride, silicon oxynitride, silicon carbide, aluminum oxide, another suitable material, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof.

In some embodiments, an etch stop material layer and a dielectric material layer are sequentially deposited. The etch stop material layer may be deposited using a CVD process, an ALD process, a PVD process, one or more other applicable processes, or a combination thereof. The dielectric material layer may be deposited using an FCVD process, a CVD process, an ALD process, another applicable process, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 3L. The planarization process may include a CMP process, a grinding process, an etching process, a dry polishing process, one or more other applicable processes, or a combination thereof. In some embodiments, the mask elements used for defining the dummy gate stacks 120A and 120B are removed during the planarization process. In some embodiments, after the planarization process, the top surfaces of the contact etch stop layer 139, the dielectric layer 140, and the dummy gate electrodes 118 are substantially level.

Figure 3M:
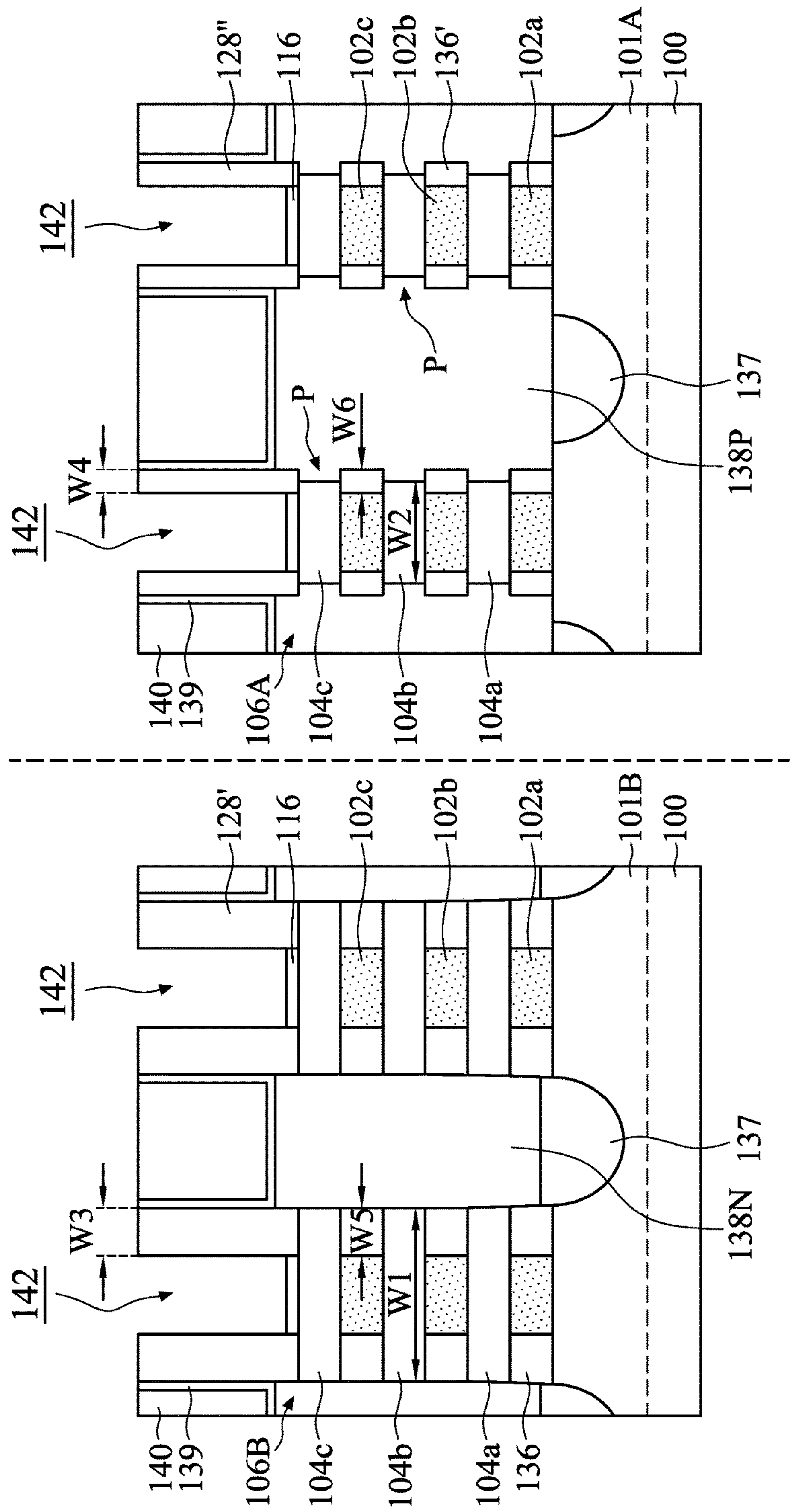

Afterwards, as shown in FIG. 3M, the dummy gate electrodes 118 are removed to form trenches 142 using one or more etching processes, in accordance with some embodiments. The trenches 142 are surrounded by the dielectric layer 140. The trenches 142 expose the dummy gate dielectric layer 116.

Figure 3N:
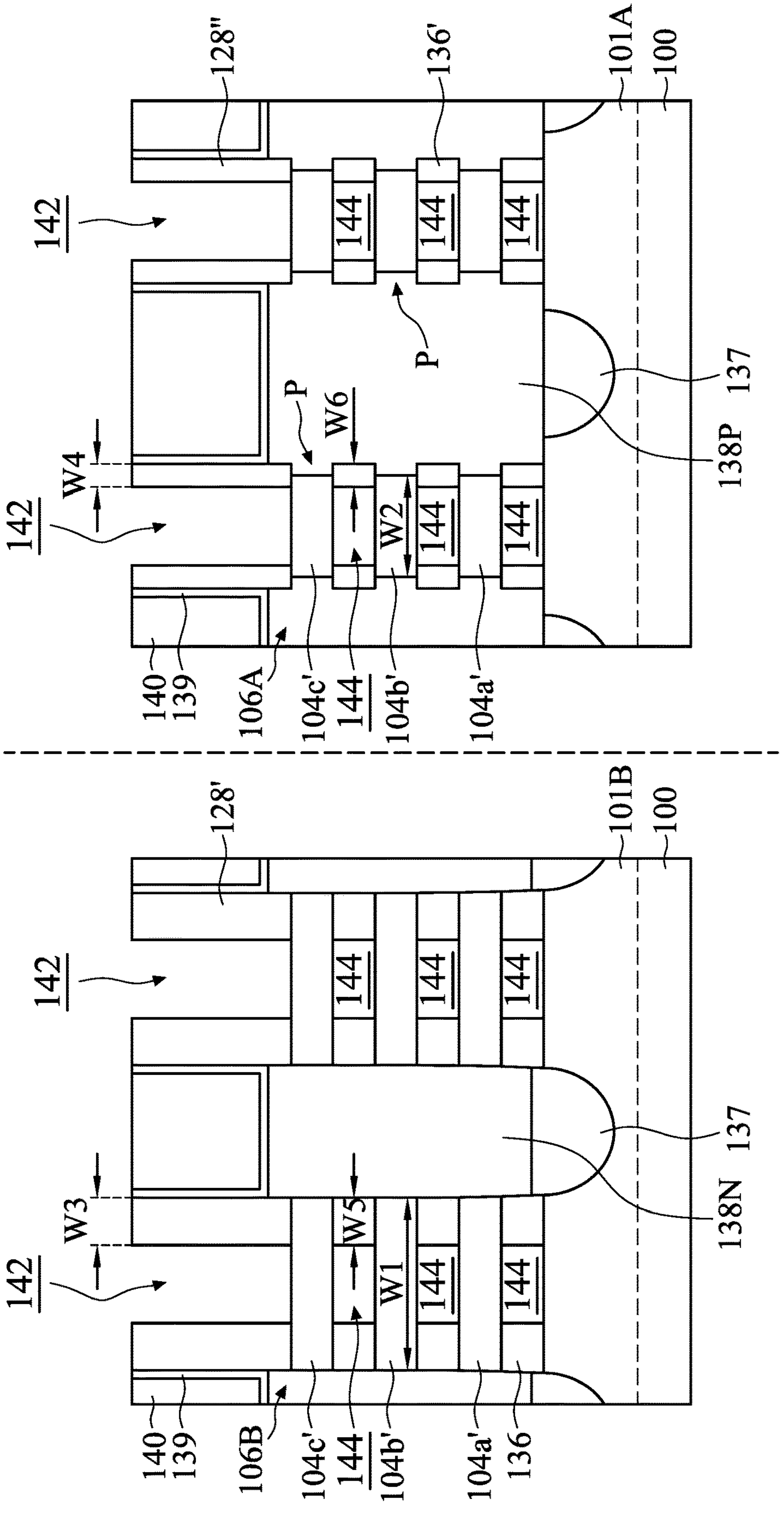
Figure 3O:
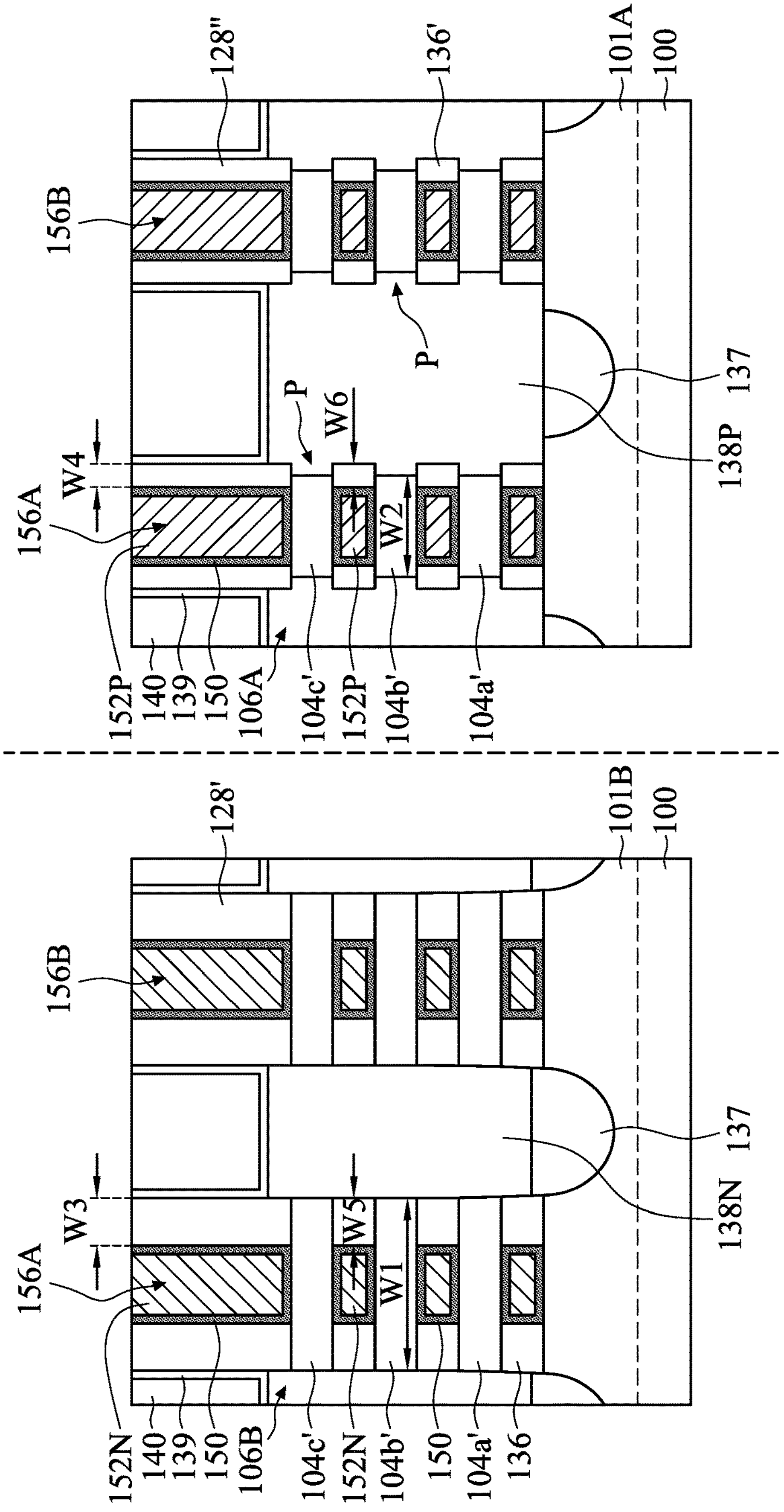

As shown in FIG. 3N, the dummy gate dielectric layer 116 and the semiconductor layers 102*a*-102*c* (which function as sacrificial layers) are removed, in accordance with some embodiments. In some embodiments, one or more etching processes are used to remove the dummy gate dielectric layer 116 and the semiconductor layers 102*a*-102*c*. As a result, recesses 144 are formed, as shown in FIG. 3N.

Due to high etching selectivity, the semiconductor layers 104*a*-104*c* are slightly (or substantially not) etched. The remaining portions of the semiconductor layers 104*a*-104*c* form multiple semiconductor nanostructures 104*a'*-104*c'*. The semiconductor nanostructures 104*a'*-104*c'* are constructed by or made up of the remaining portions of the semiconductor layers 104*a*-104*c*. The semiconductor nanostructures 104*a'*-104*c'* suspended over the semiconductor fins 101A and 101B may function as channel structures of transistors.

In some other embodiments, the etchant used for removing the semiconductor layers 102*a*-102*c* also slightly removes the semiconductor layers 104*a*-104*c* that form the semiconductor nanostructures 104*a'*-104*c'*. As a result, the obtained semiconductor nanostructures 104*a'*-104*c'* become thinner after the removal of the semiconductor layers 102*a*-102*c*. In some embodiments, each of the semiconductor nanostructures 104*a'*-104*c'* is thinner than the edge portions since the edge portions are surrounded by other elements and thus are prevented from being reached and etched by the etchant.

After the removal of the semiconductor layers 102*a*-102*c* (which function as sacrificial layers), the recesses 144 are formed. The recesses 144 connect to the trench 142 and surround each of the semiconductor nanostructures 104*a'*-104*c'*. As shown in FIG. 3N, even if the recesses 144 between the semiconductor nanostructures 104*a'*-104*c'* are formed, the semiconductor nanostructures 104*a'*-104*c'* remain held by the epitaxial structures 138N or 138P. Therefore, after the removal of the semiconductor layers 102*a*-102*c* (which function as sacrificial layers), the released semiconductor nanostructures 104*a'*-104*c'* are prevented from falling.

During the removal of the semiconductor layers 102*a*-102*c* (which function as sacrificial layers), the inner spacers 136 and the trimmed inner spacers 136' protect the epitaxial structures 138N and 138P from being etched or damaged. The quality and reliability of the semiconductor device structure are improved.

As shown in FIG. 3O, metal gate stacks 156A and 156B are formed to fill the trenches 142, in accordance with some embodiments. The metal gate stacks 156A and 156B further extend into the recesses 144 to wrap around each of the semiconductor nanostructures 104*a'*-104*c'*.

Each of the metal gate stacks 156A and 156B includes multiple metal gate stack layers. Each of the metal gate stacks 156A and 156B may include a gate dielectric layer 150 and metal gate electrodes 152P and 152N. Each of the metal gate electrodes 152P and 152N may include a work function layer. Each of the metal gate electrodes 152P and 152N may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104*a'*-104*c'*.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104*a*'-104*c*'. The interfacial layers are very thin and are made of, for example, silicon oxide or germanium oxide. In some embodiments, the interfacial layers are formed by applying an oxidizing agent on the surfaces of the semiconductor nanostructures 104*a*'-104*c*'. For example, a hydrogen peroxide-containing liquid may be applied or provided on the surfaces of the semiconductor nanostructures 104*a*'-104*c*' so as to form the interfacial layers.

The work function layer of the metal gate electrodes 152P and 152N may be used to provide the desired work function for transistors to enhance device performance including improved threshold voltage. The metal gate electrodes 152P and 152N may have different work function layers. In some embodiments, the work function layer surrounding the semiconductor nanostructures 104*a*'-104*c*' of the fin structure 106A is used for forming a PMOS device. In these cases, the work function layer of the metal gate electrode 152P is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some embodiments, the work function layer surrounding the semiconductor nanostructures 104*a*'-104*c*' of the fin structure 106B is used for forming an NMOS device. The work function layer of the metal gate electrode 152N is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof. In some embodiments, the formation of the work function layer involves one or more patterning processes. As a result, the n-type work function layer and the p-type work function layer are selectively formed over different regions.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152N and 152P are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIG. 3O.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144.

In some embodiments, the left portion of FIG. 3O shows NMOS devices, and the right portion of FIG. 3O shows PMOS devices. In some embodiments, the NMOS devices have thicker gate spacers (the gate spacers 128') and thicker inner spacers (the inner spacers 136), which provides lower effective capacitance. The performance and reliability of the NMOS devices are ensured. In some embodiments, the PMOS devices have thinner gate spacers (the gate spacers 128") and thinner inner spacers (the inner spacers 136'), which provides higher on-current. The performance and reliability of the PMOS devices are ensured.

As mentioned above, in some embodiments, the width ratio W4/W3 is within a range from about 30% to about 90%. In some cases, if the width ratio W4/W3 is higher than about 90%, the trimmed gate spacers 128" may be too thick. The uppermost protruding portions P of the epitaxial structures 138P may be too wide and thus have high resistance. In some other cases, if the width ratio W4/W3 is lower than about 30%, the trimmed gate spacers 128" may be too thin. The trimmed gate spacers 128" that are too thin may not be able to sustain the subsequent formation processes and/or may induce high capacitance.

As mentioned above, in some embodiments, the width ratio W6/W5 is within a range from about 30% to about 90%. In some cases, if the width ratio W6/W5 is higher than about 90%, the trimmed inner spacers 136' may be too thick. The protruding portions P of the epitaxial structures 138P may be too wide and thus have high resistance. In some other cases, if the width ratio W6/W5 is lower than about 30%, the trimmed inner spacers 136' may be too thin. The trimmed inner spacers 136' that are too thin may not be able to sustain the subsequent formation processes and/or may induce high capacitance.

As shown in FIG. 3O, each of the trimmed inner spacers 136' has an inner edge and an outer edge. The inner edge is positioned between the outer edge and the metal gate stack 156A (or 156B). In some embodiments, the interface between the epitaxial structure 138P and one of the semiconductor nanostructures 104*a*'-104*c*' is laterally between the inner edge and the outer edge of the trimmed inner spacer 136' that is nearby.

Many variations and/or modifications can be made to embodiments of the disclosure. In some other embodiments, the epitaxial structures 138P are formed before the epitaxial structures 138N. In some embodiments, the trimming of the gate spacers 128' and/or the inner spacers 136 are performed before the formation of the epitaxial structures 138P and 138N.

In some embodiments, the trimming of the gate spacers is performed before the trimming of the inner spacers. However, embodiments of the disclosure are not limited thereto. Many variations and/or modifications can be made to embodiments of the disclosure. In some other embodiments, the trimming of the gate spacers and the trimming of the inner spacers are performed simultaneously.

Figure 4A:
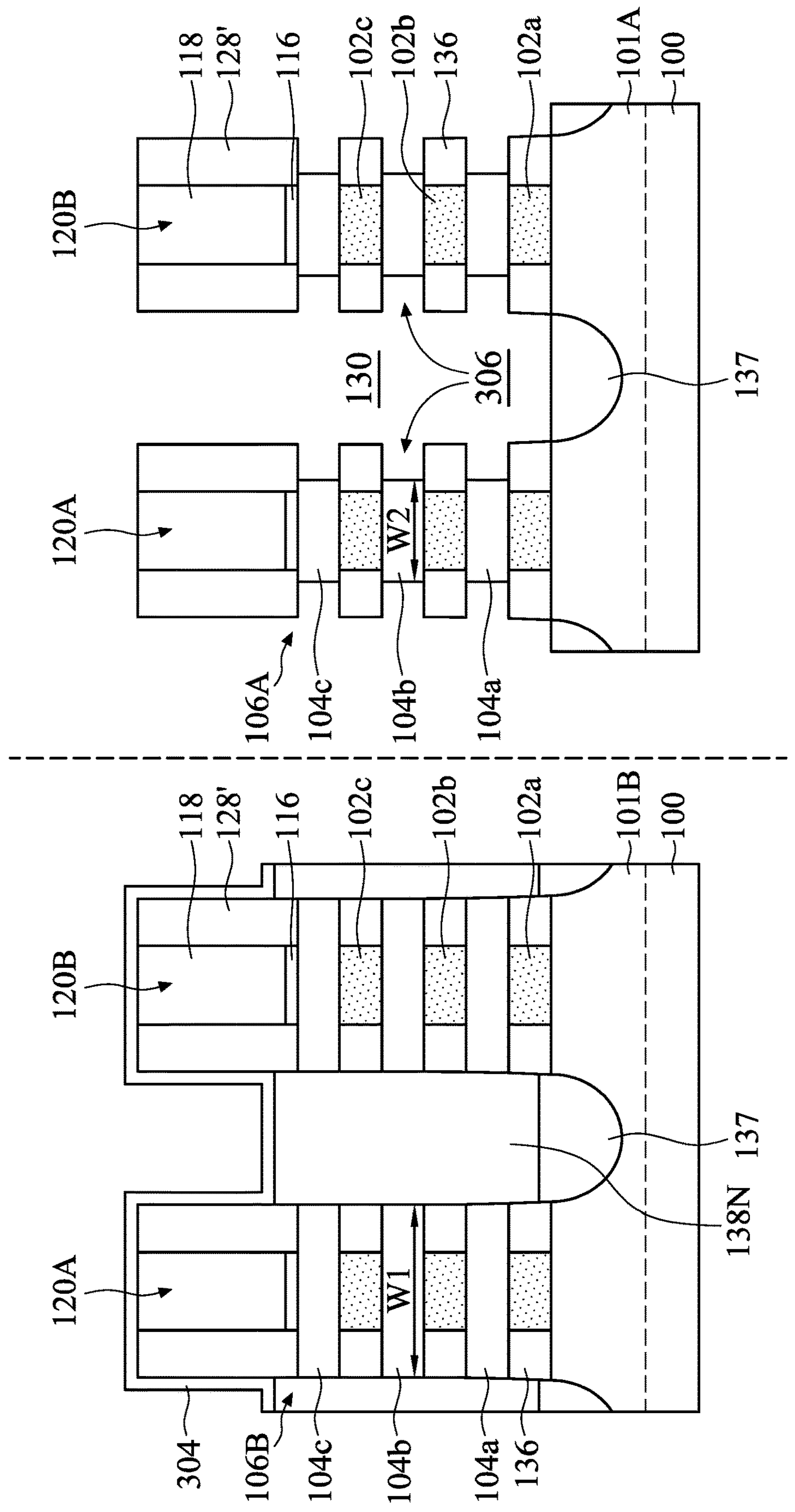
FIGS. 4A-4C are cross-sectional views of various stages of a process for forming portions of a semiconductor device structure, in accordance with some embodiments.
Figure 4B:
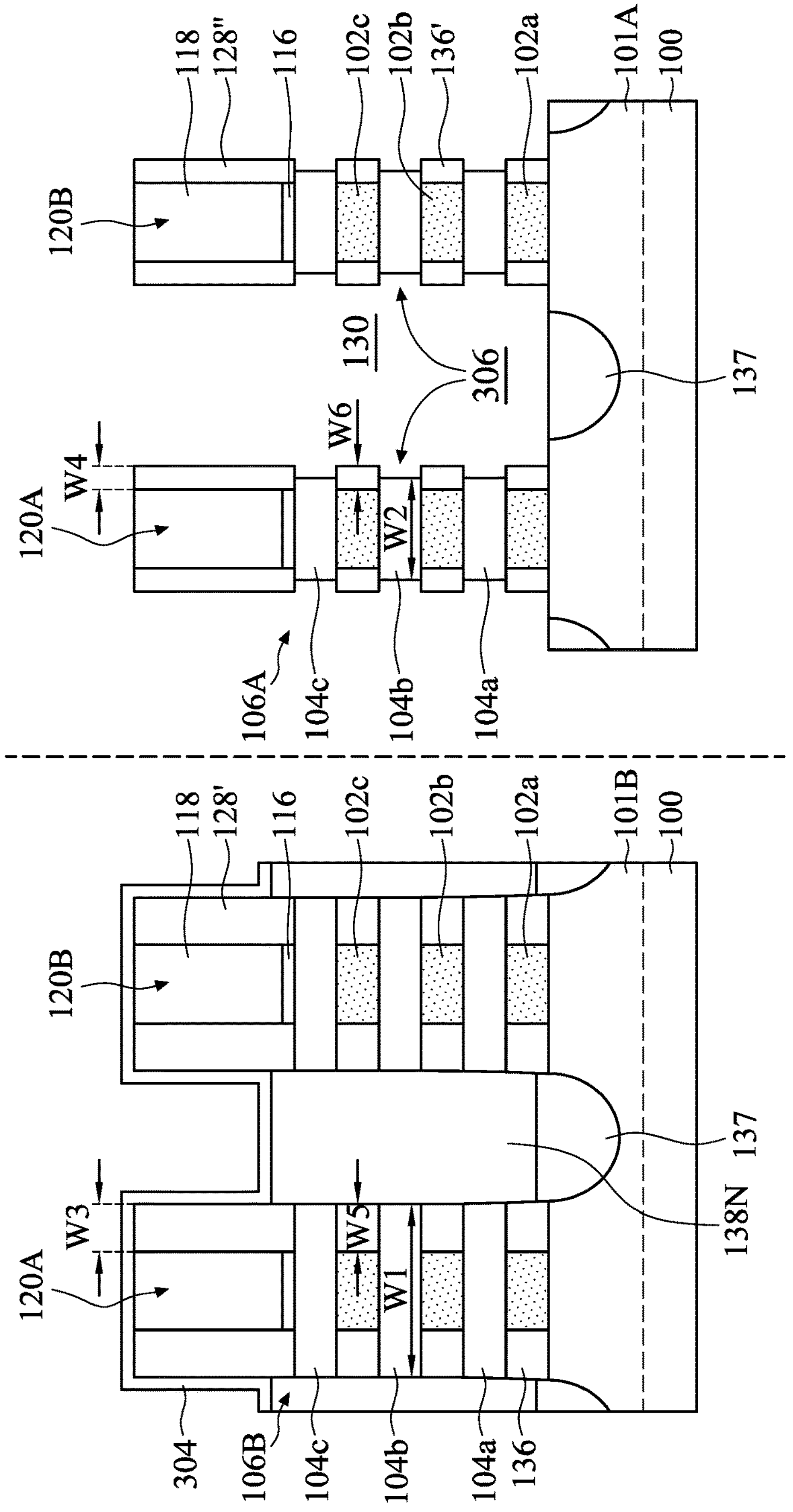
Figure 4C:
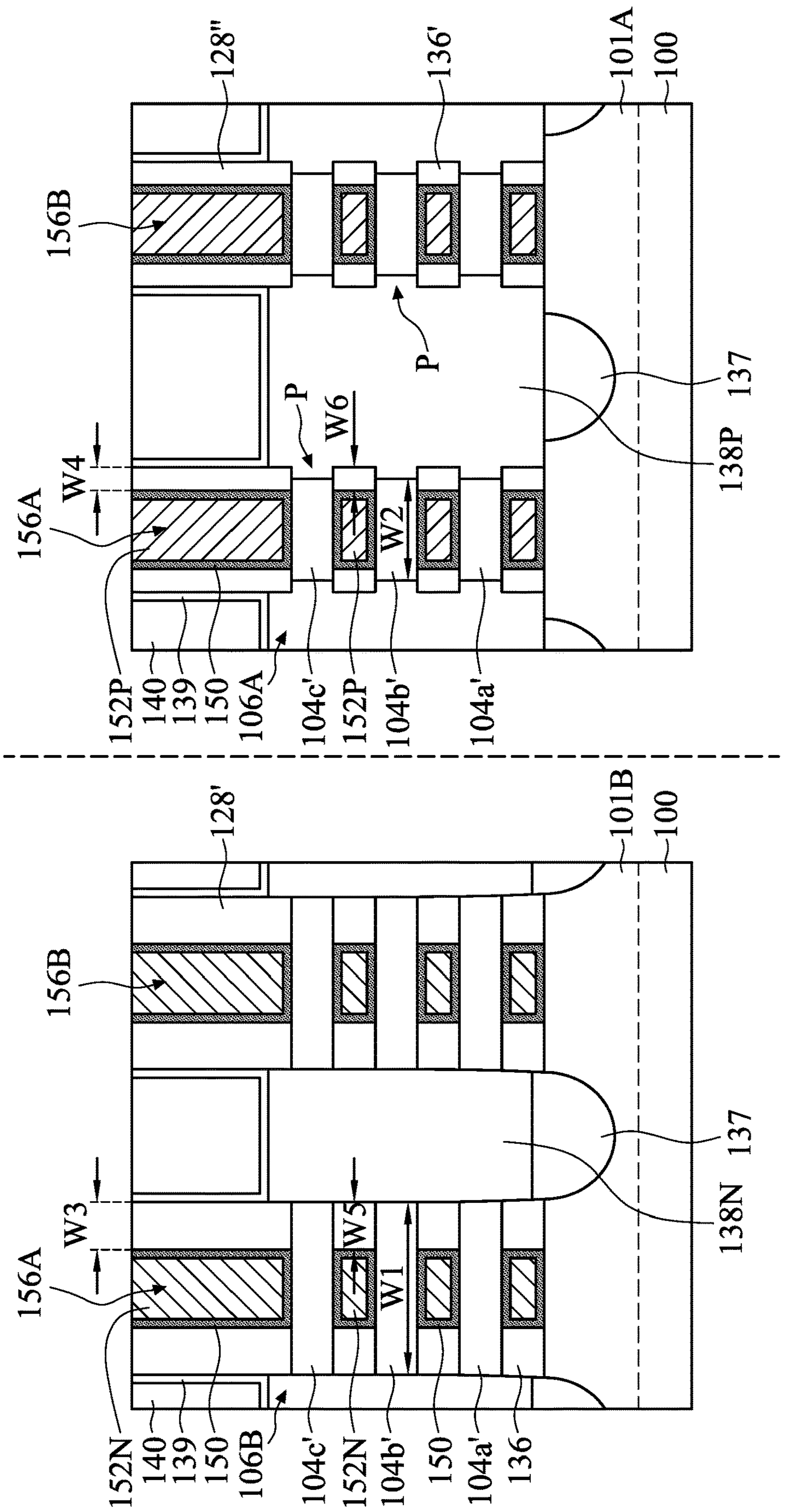

FIGS. 4A-4C are cross-sectional views of various stages of a process for forming portions of a semiconductor device structure, in accordance with some embodiments. As shown in FIG. 4A, a structure that is the same as or similar to the structure shown in FIG. 3H is formed.

Afterwards, an etching process is used to trim the exposed gate spacers and the exposed inner spacers, as shown in FIG. 4B. As a result, the trimmed gate spacers 128" and the trimmed inner spacers 136' are formed simultaneously. The structure shown in FIG. 4B may be the same as or similar to the structure shown in FIG. 3J.

Afterwards, the processes that are the same as or similar to those illustrated in FIGS. 3K-3O are performed. As a result, the structure shown in FIG. 4C is formed, in accordance with some embodiments. The structure shown in FIG. 4C may be the same as or similar to the structure shown in FIG. 3O.

In some embodiments, the trimming of the gate spacers is performed before the trimming of the inner spacers. However, embodiments of the disclosure are not limited thereto. Many variations and/or modifications can be made to embodiments of the disclosure. In some other embodiments, the trimming of the inner spacers is performed before the trimming of the gate spacers.

Figure 5A:
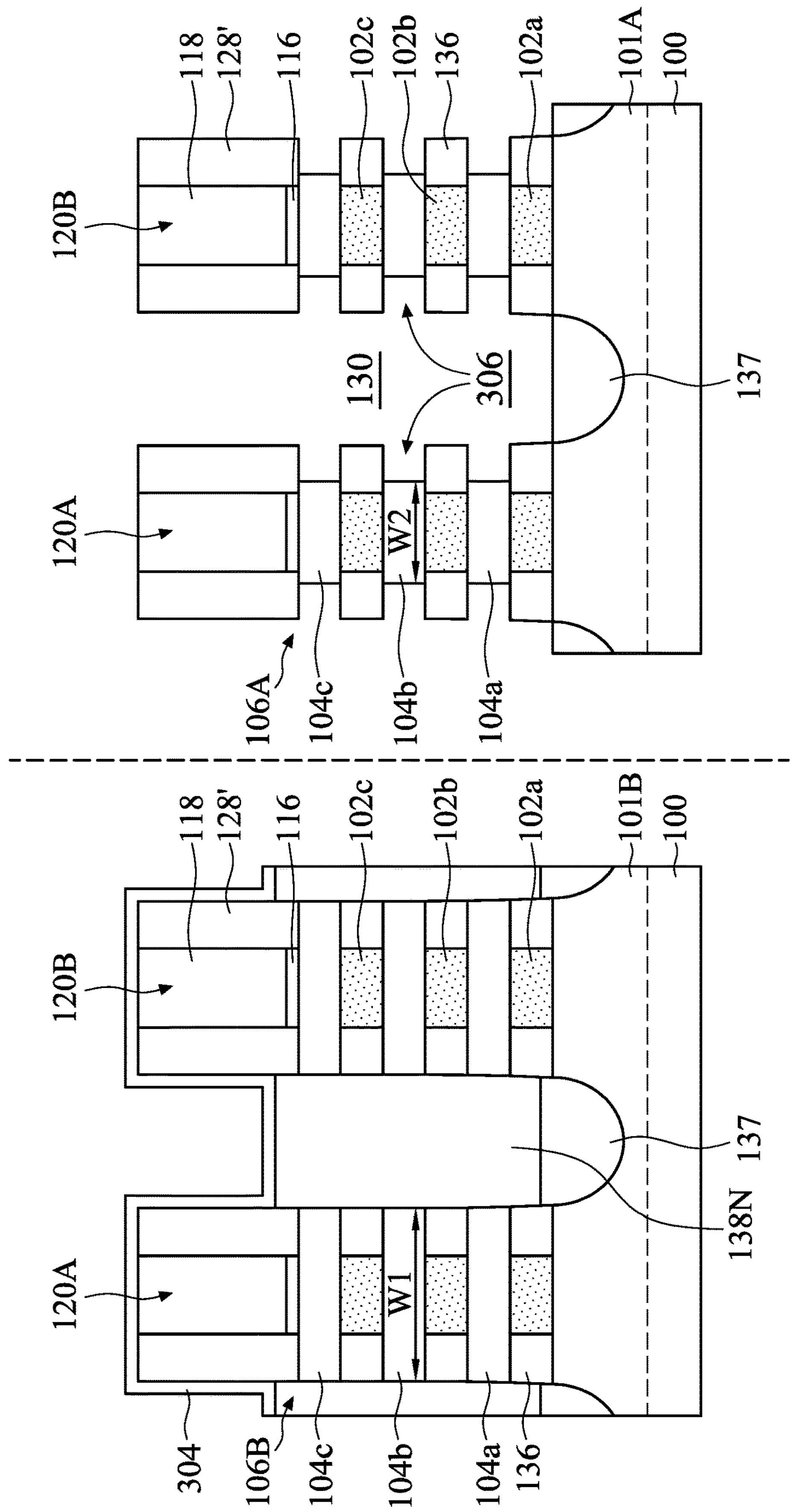
FIGS. 5A-5D are cross-sectional views of various stages of a process for forming portions of a semiconductor device structure, in accordance with some embodiments.

FIGS. 5A-5D are cross-sectional views of various stages of a process for forming portions of a semiconductor device structure, in accordance with some embodiments. As shown in FIG. 5A, a structure that is the same as or similar to the structure shown in FIG. 3H is formed.

Figure 5B:
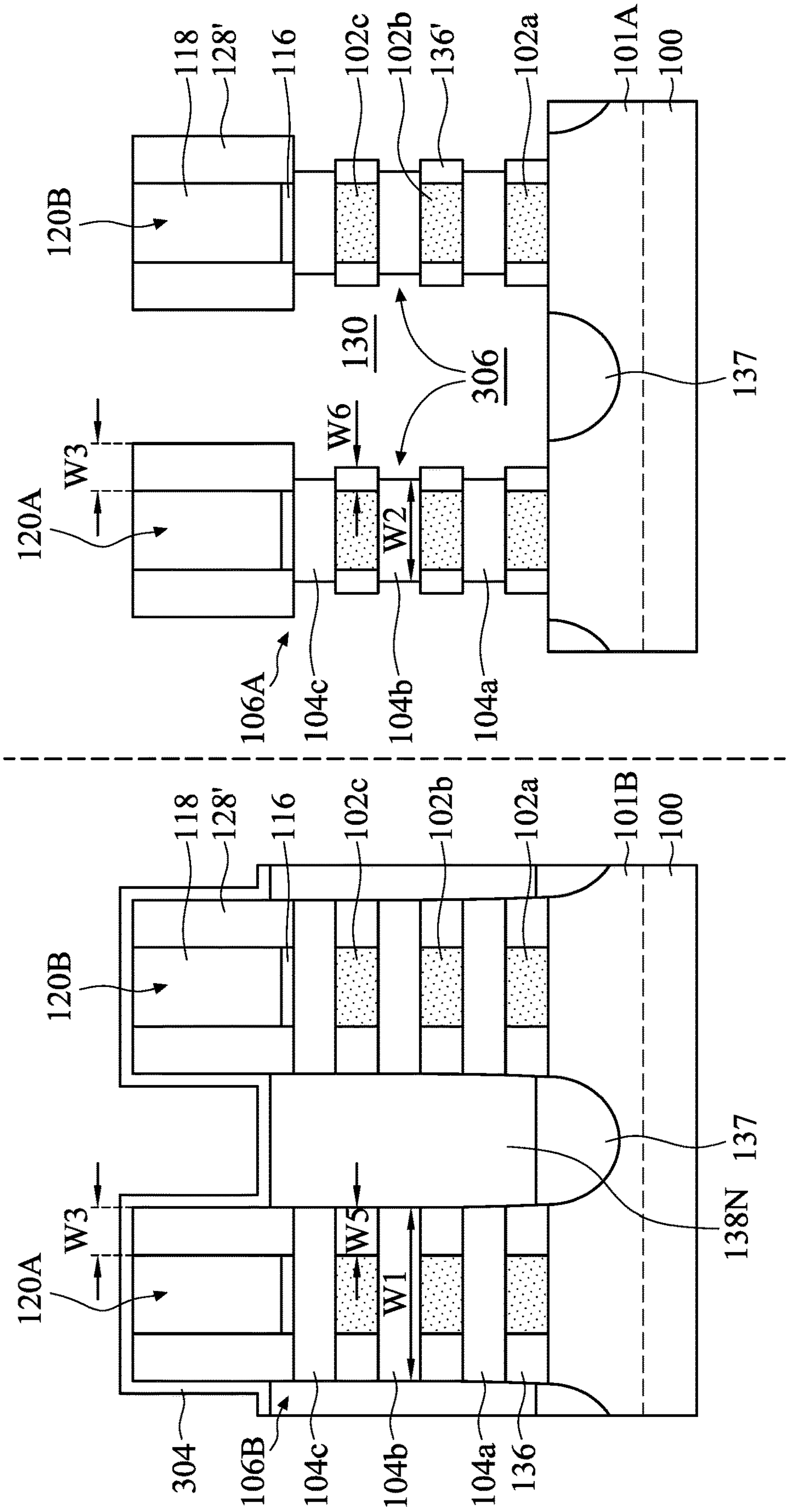

As shown in FIG. 5B, the inner spacers 136 covering the semiconductor layers 102*a*-102*c* of the fin structure 106A are partially removed to form trimmed inner spacers 136', in accordance with some embodiments. One or more etching processes may be used to trim the exposed inner spacers 136 into the trimmed inner spacers 136'. As a result, the trimmed inner spacers 136' become thinner than the inner spacers 136 that are not trimmed.

Figure 5C:
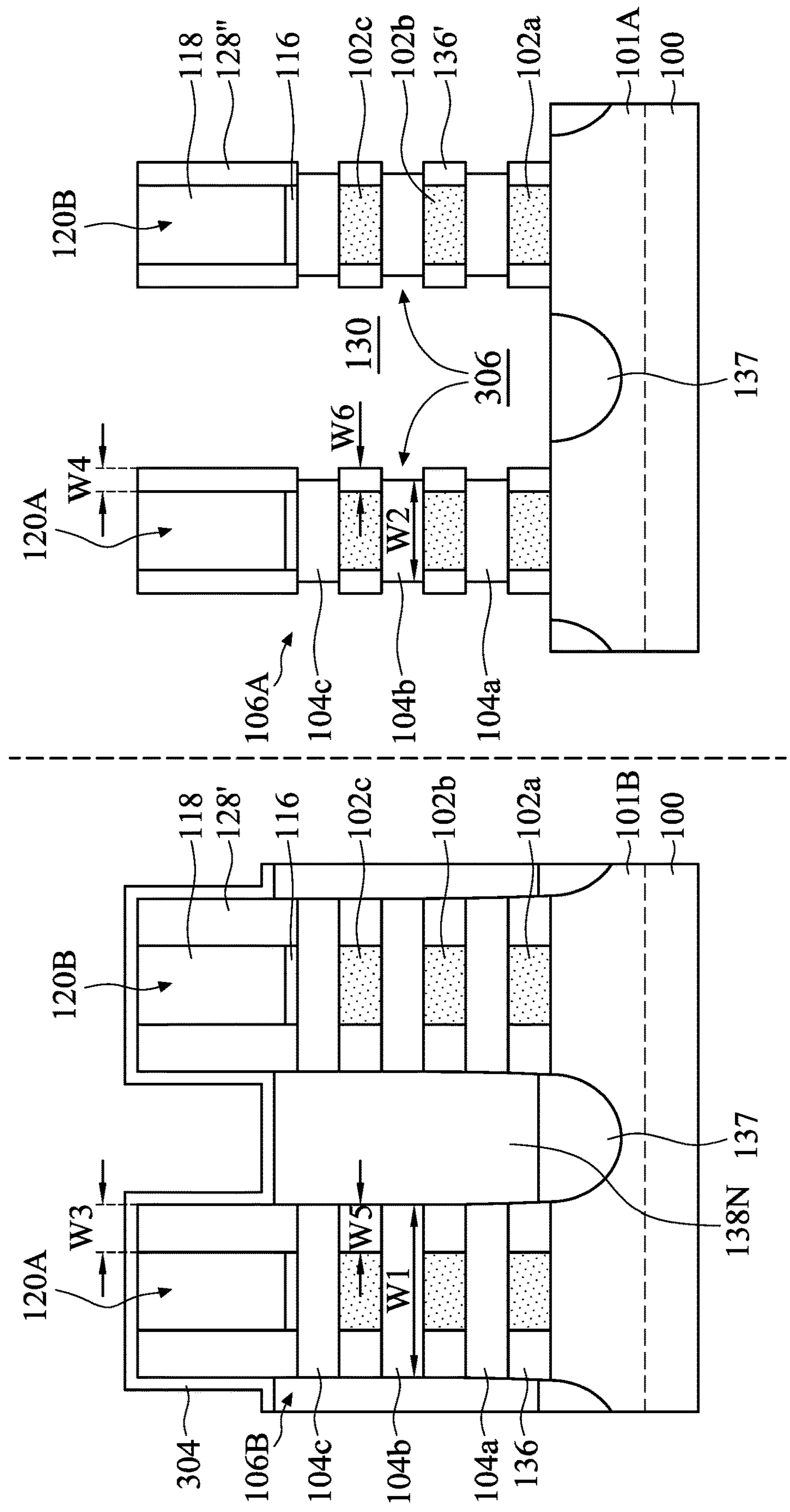

As shown in FIG. 5C, the exposed portions of the gate spacers 128' are partially removed to form trimmed gate spacers 128", in accordance with some embodiments. One or more etching processes may be used to trim the exposed portions of the gate spacers 128' into the trimmed gate spacers 128". The portions of the gate spacers 128' under the mask element 304 are prevented from being trimmed. The structure shown in FIG. 5C may be the same as or similar to the structure shown in FIG. 3J.

Figure 5D:
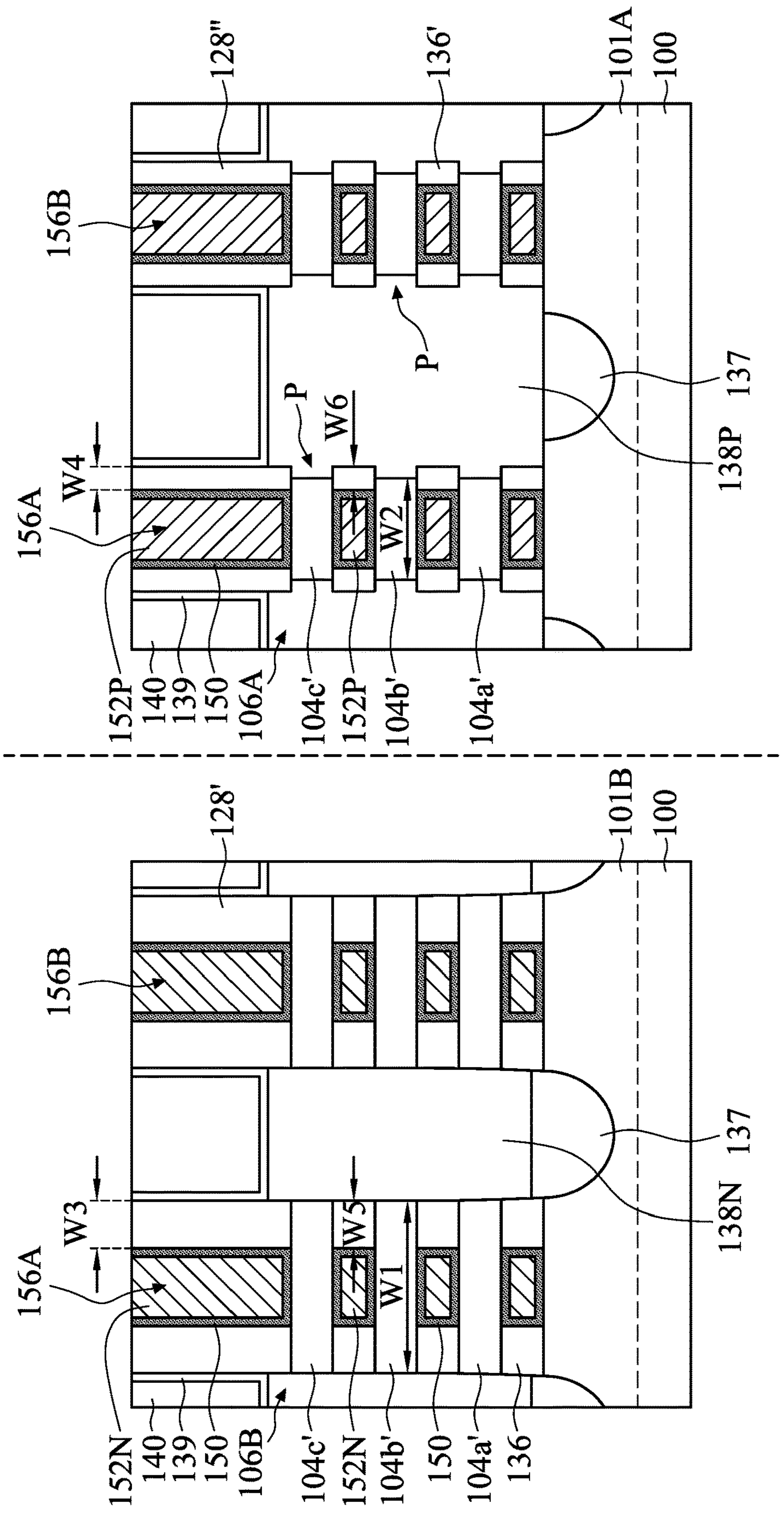

Afterwards, the processes that are the same as or similar to those illustrated in FIGS. 3K-3O are performed. As a result, the structure shown in FIG. 5D is formed, in accordance with some embodiments. The structure shown in FIG. 5D may be the same as or similar to the structure shown in FIG. 3O.

In some embodiments, some of the gate spacers and the inner spacers are further trimmed. However, embodiments of the disclosure are not limited thereto. Many variations and/or modifications can be made to embodiments of the disclosure. In some other embodiments, the gate spacers are not further trimmed, and some of the inner spacers are further trimmed.

Figure 6:
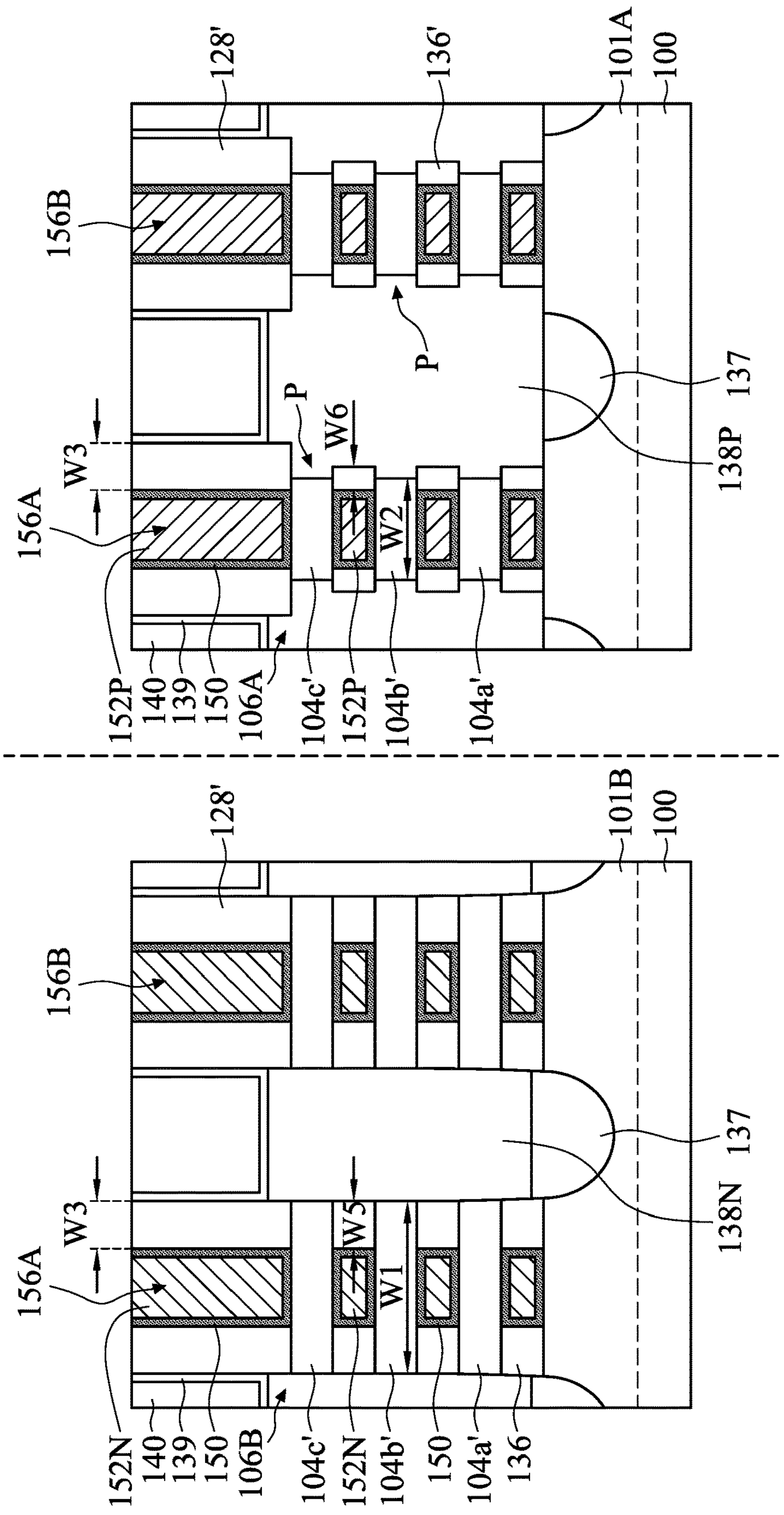
FIG. 6 is a cross-sectional view of portions of a semiconductor device structure, in accordance with some embodiments.

FIG. 6 is a cross-sectional view of portions of a semiconductor device structure, in accordance with some embodiments. In some embodiments, the inner spacers adjacent to the epitaxial structures 138P are trimmed to form trimmed inner spacers 136'. Each of the inner spacers 136 is wider than each of the trimmed inner spacers 136'. In some embodiments, the entirety of the gate spacers 128' are not further trimmed. The portions of the gate spacers 128' over the epitaxial structures 138P and over the epitaxial structures 138N are substantially as wide as each other.

In some embodiments, some of the gate spacers and the inner spacers are further trimmed. However, embodiments of the disclosure are not limited thereto. Many variations and/or modifications can be made to embodiments of the disclosure. In some other embodiments, the inner spacers are not further trimmed, and portions of the gate spacers are further trimmed.

Figure 7:
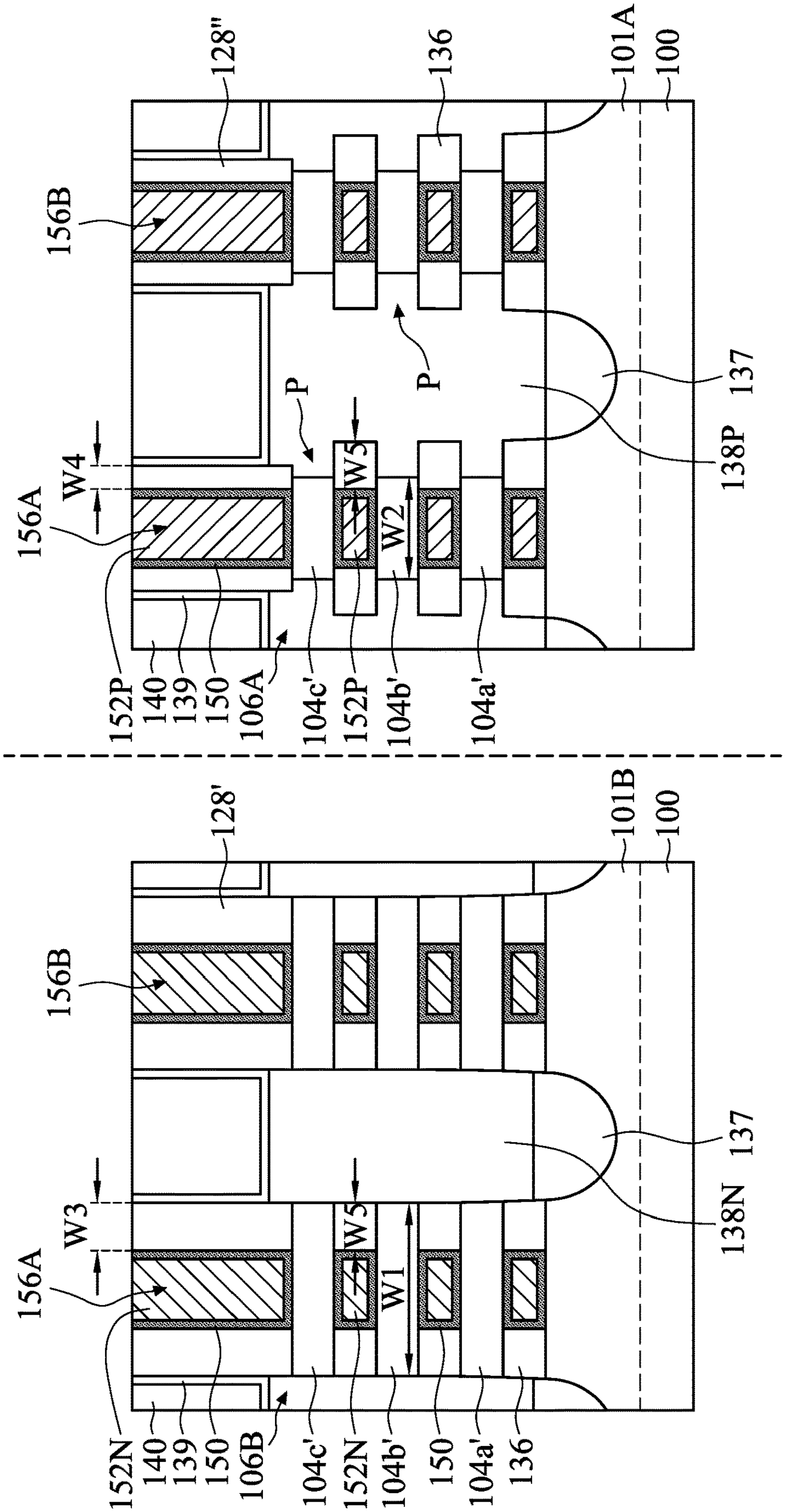
FIG. 7 is a cross-sectional view of portions of a semiconductor device structure, in accordance with some embodiments.

FIG. 7 is a cross-sectional view of portions of a semiconductor device structure, in accordance with some embodiments. In some embodiments, the portions of the gate spacers 128' over the epitaxial structures 138P are trimmed to form trimmed gate spacers 128". Each of the gate spacers 128' is wider than each of the trimmed gate spacers 128". In some embodiments, the inner spacers 136 adjacent to the epitaxial structures 138P and 138N are not further trimmed.

Many variations and/or modifications can be made to embodiments of the disclosure. In some embodiments, bottom isolation structures are formed between the epitaxial structures and the semiconductor isolation structures. The bottom isolation structures may be used to reduce or prevent leakage current from the epitaxial structures.

Figure 8A:
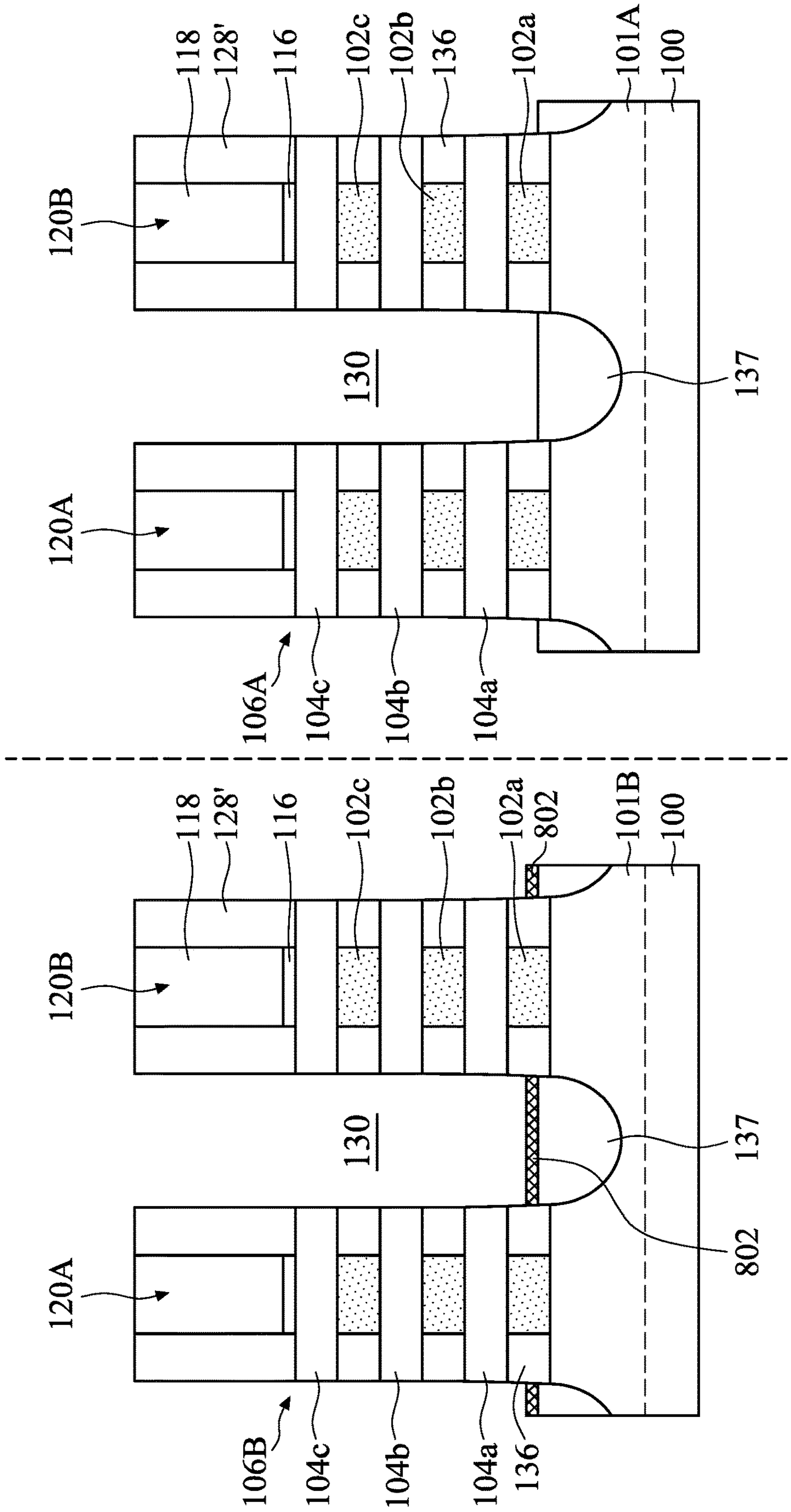
FIGS. 8A-8B are cross-sectional views of various stages of a process for forming portions of a semiconductor device structure, in accordance with some embodiments.
Figure 8B:
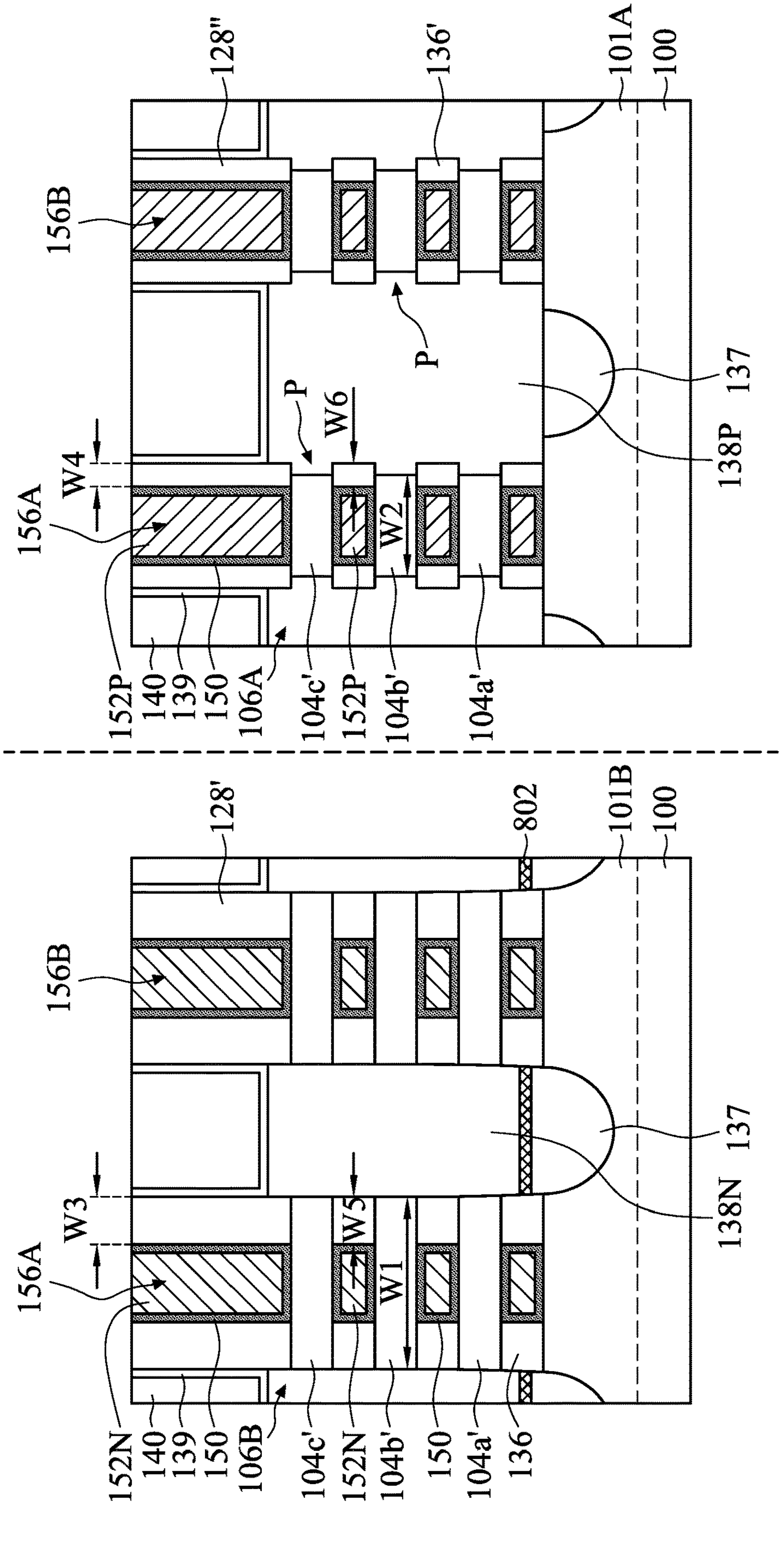

FIGS. 8A-8B are cross-sectional views of various stages of a process for forming portions of a semiconductor device structure, in accordance with some embodiments. As shown in FIG. 8A, a structure that is similar to the structure shown in FIG. 3E is formed. Afterwards, bottom isolation structures 802 are selectively formed on the semiconductor isolation structures 137 formed on the semiconductor fin 101B, as shown in FIG. 8A in accordance with some embodiments.

In some embodiments, the bottom isolation structures 802 are made of or include a dielectric material. The dielectric material may include silicon oxide, silicon nitride, carbon-containing silicon nitride, carbon-containing silicon oxynitride, carbon-containing silicon oxide, aluminum oxide, hafnium oxide, another suitable material, or a combination thereof. The formation of the bottom isolation structures 802 may involve one or more deposition processes and one or more patterning processes.

Afterwards, the processes that are the same as or similar to those illustrated in FIGS. 3F-3O are performed. As a result, the structure shown in FIG. 8B is formed, in accordance with some embodiments. The bottom isolation structures 802 may prevent current from the epitaxial structures 138N from entering the semiconductor fin 101B.

Figure 9A:
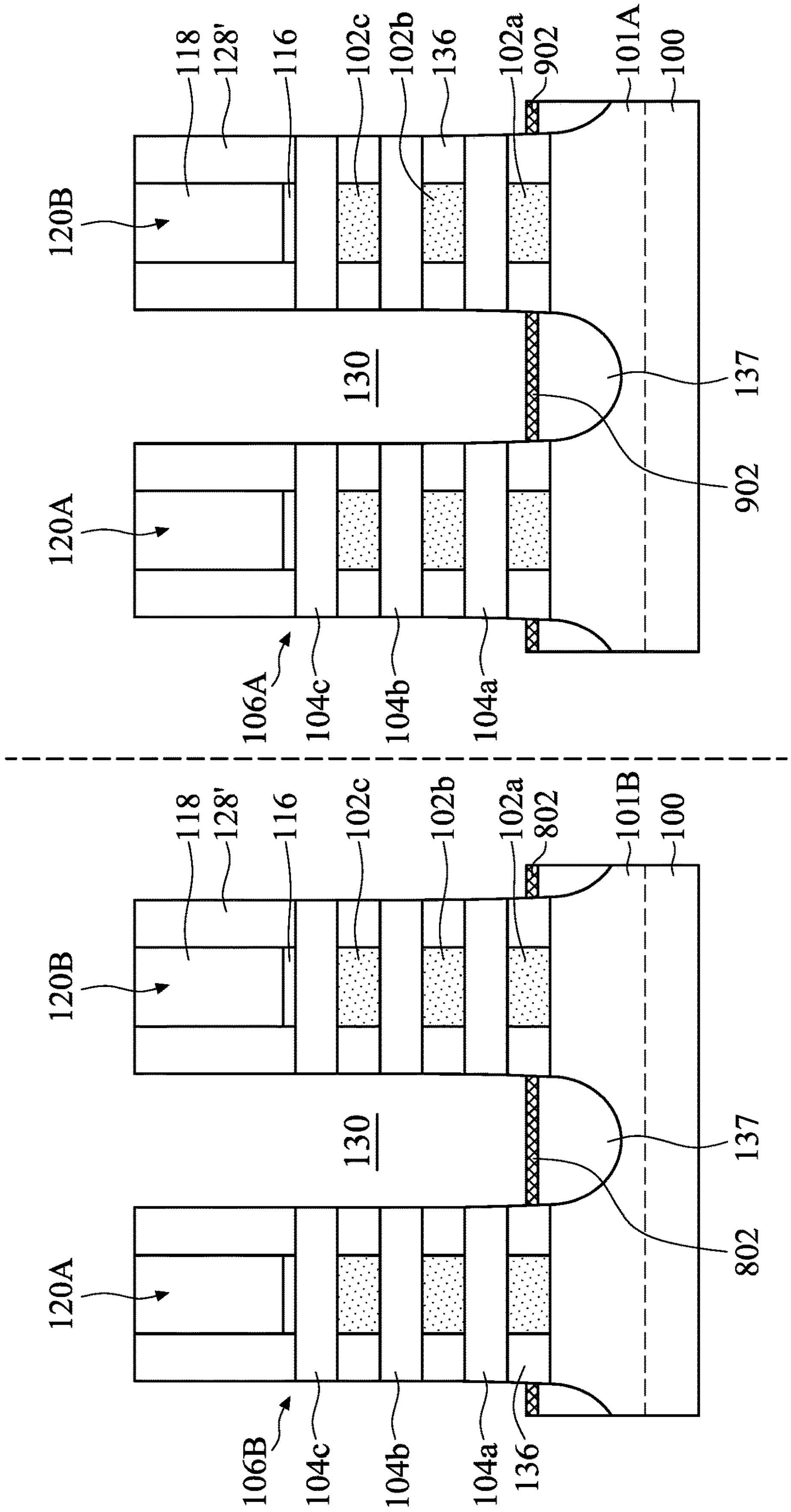
FIGS. 9A-9B are cross-sectional views of various stages of a process for forming portions of a semiconductor device structure, in accordance with some embodiments.
Figure 9B:
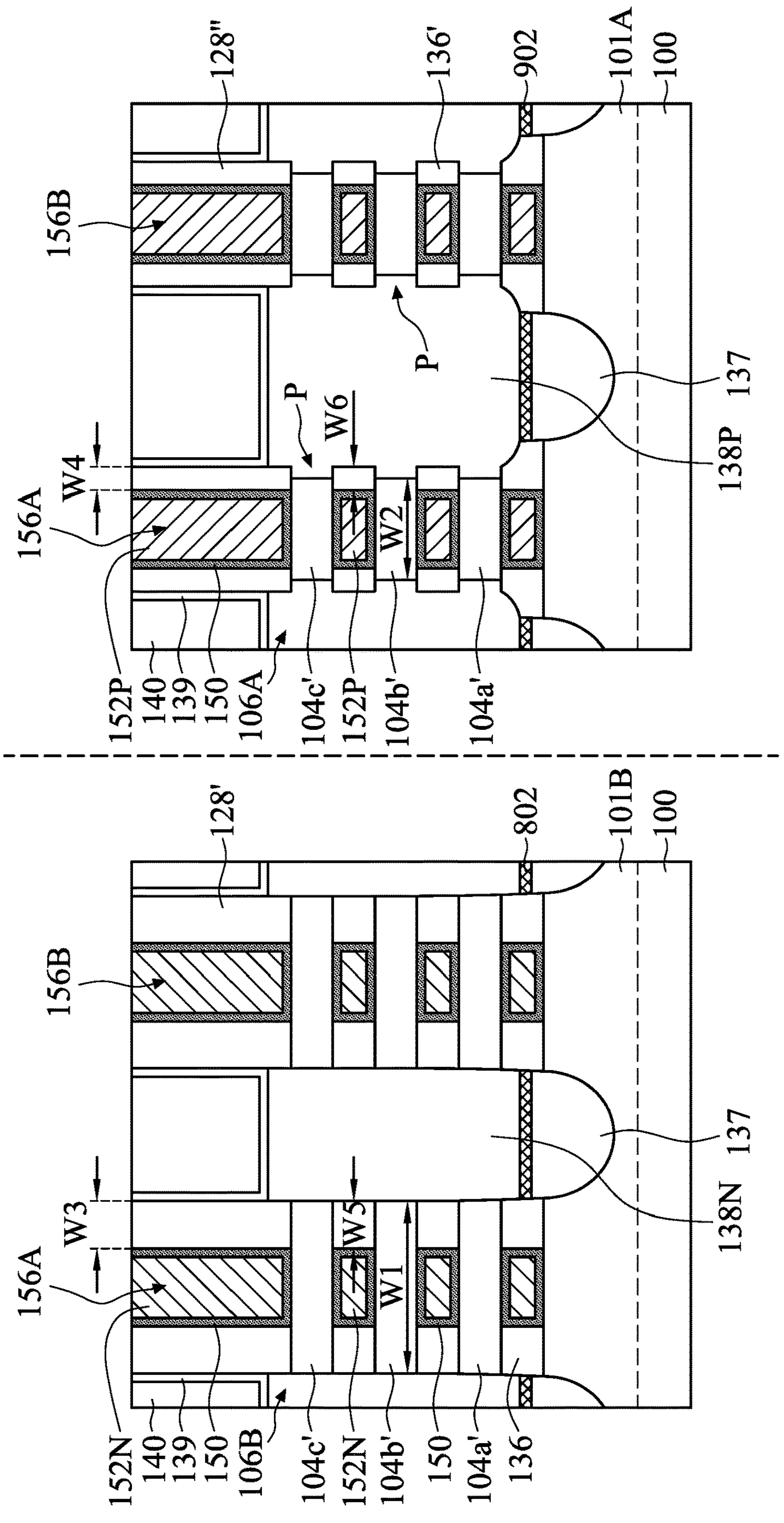

Many variations and/or modifications can be made to embodiments of the disclosure. FIGS. 9A-9B are cross-sectional views of various stages of a process for forming portions of a semiconductor device structure, in accordance with some embodiments. As shown in FIG. 9A, a structure that is similar to the structure shown in FIG. 3E is formed. Afterwards, bottom isolation structures 802 and 902 are respectively formed on the semiconductor isolation structures 137 formed on the semiconductor fins 101A and 101B, as shown in FIG. 9A in accordance with some embodiments.

In some embodiments, the bottom isolation structures 802 and 902 are made of or include a dielectric material. The dielectric material may include silicon oxide, silicon nitride, carbon-containing silicon nitride, carbon-containing silicon oxynitride, carbon-containing silicon oxide, aluminum oxide, hafnium oxide, another suitable material, or a combination thereof. The formation of the bottom isolation structures 802 and 902 may involve one or more deposition processes and one or more patterning processes.

Afterwards, the processes that are the same as or similar to those illustrated in FIGS. 3F-3O are performed. As a result, the structure shown in FIG. 9B is formed, in accordance with some embodiments. The bottom isolation structures 802 may prevent current from the epitaxial structures 138N from entering the semiconductor fin 101B. The bottom isolation structures 902 may prevent current from the epitaxial structures 138P from entering the semiconductor fin 101A.

In some embodiments, the semiconductor nanostructures 104*a*'-104*c*' between the epitaxial structures 138N are substantially as thick as the semiconductor nanostructures between the epitaxial structures 138P. However, embodiments of the disclosure are not limited thereto. Many variations and/or modifications can be made to embodiments of the disclosure. In some other embodiments, the semiconductor nanostructures 104*a*'-104*c*' between the epitaxial structures 138N are thinner than the semiconductor nanostructures between the epitaxial structures 138P.

Figure 10A:
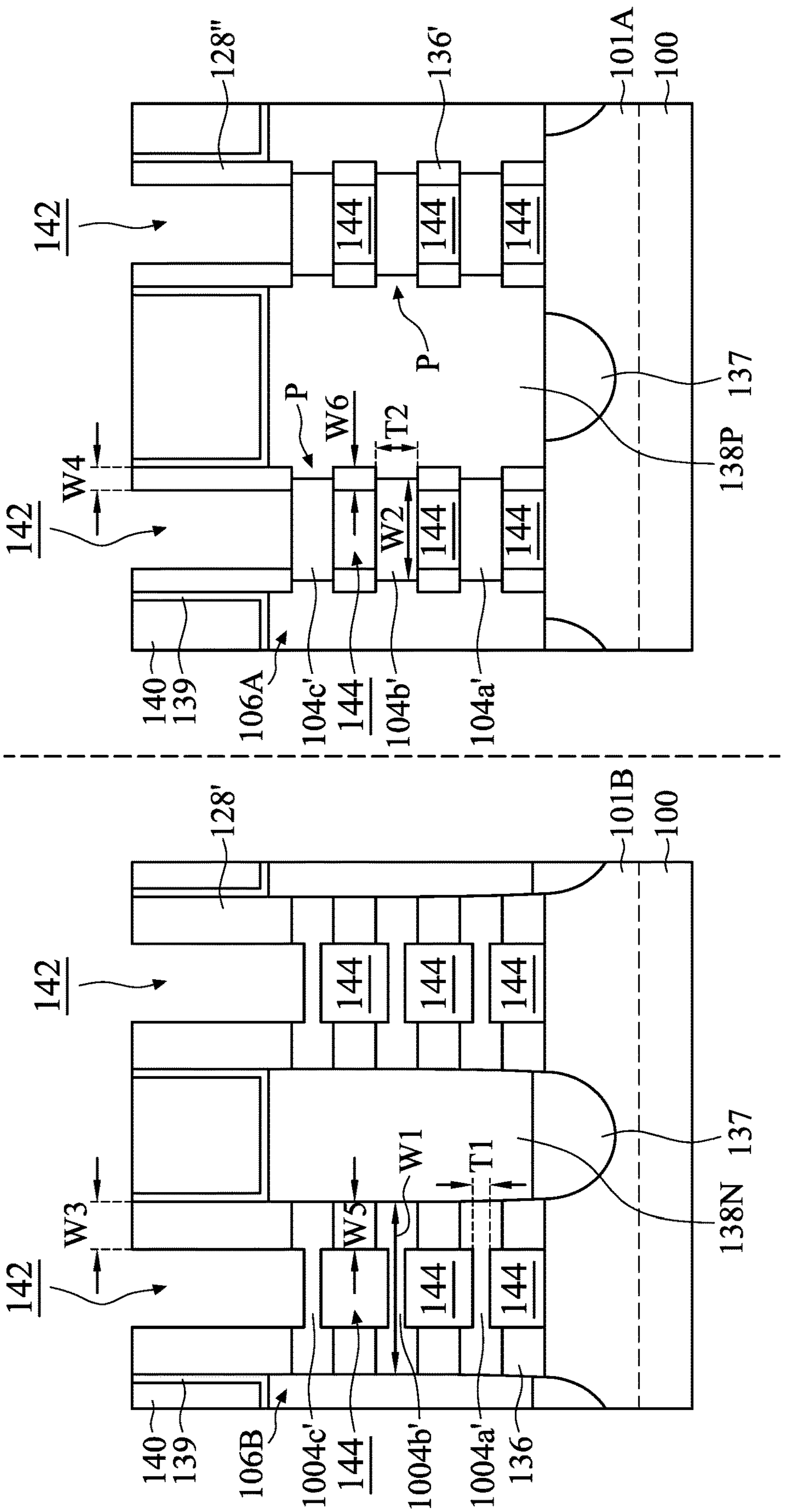
FIGS. 10A-10B are cross-sectional views of various stages of a process for forming portions of a semiconductor device structure, in accordance with some embodiments.
Figure 10B:
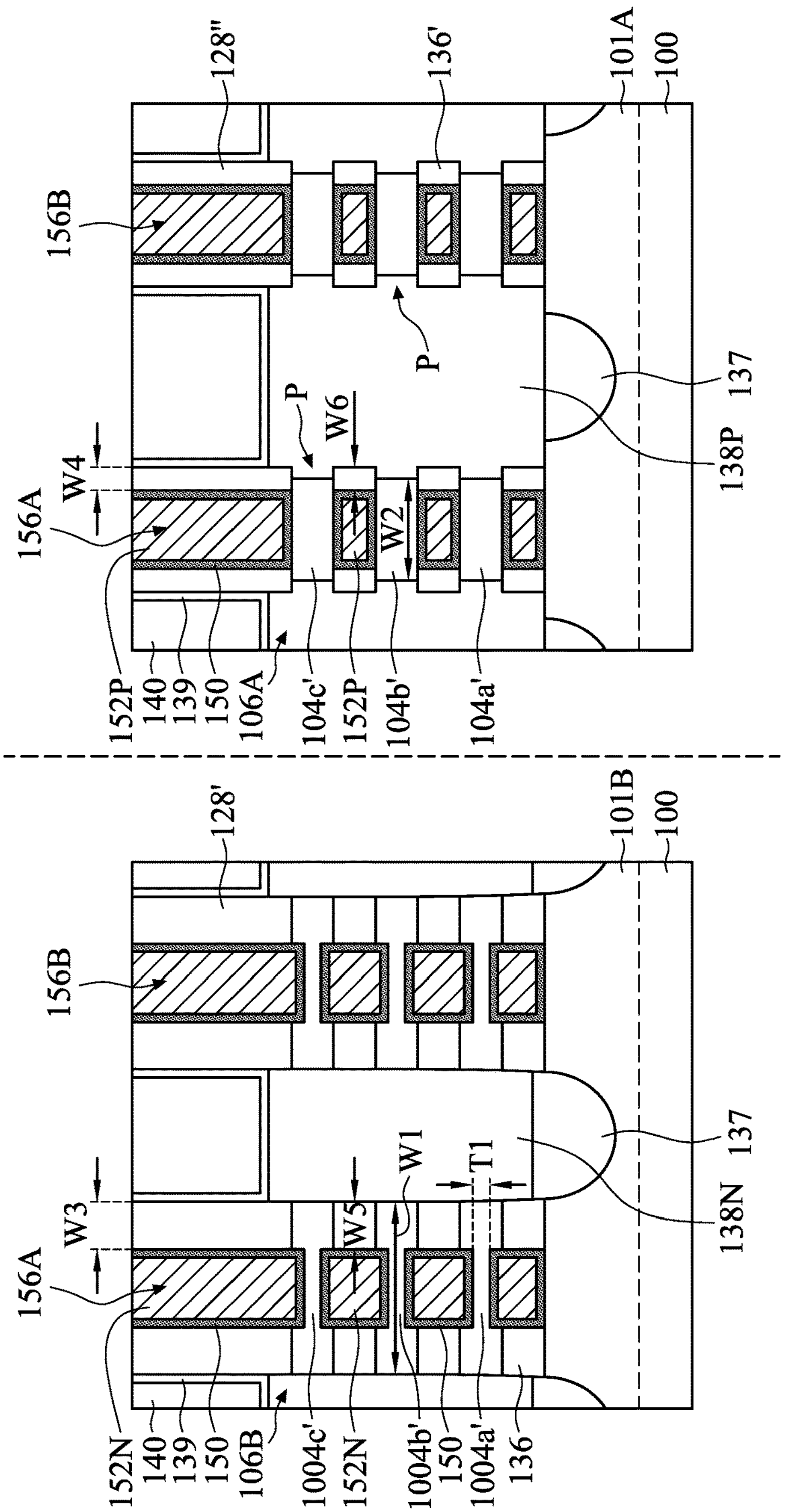

FIGS. 10A-10B are cross-sectional views of various stages of a process for forming portions of a semiconductor device structure, in accordance with some embodiments. As shown in FIG. 10A, a structure that is similar to the structure shown in FIG. 3N is formed. In some embodiments, the removal of the semiconductor layers 102*a*-102*c* of the fin structure 106A and the removal of the semiconductor layers 102*a*-102*c* of the fin structure 106B are performed separately. Mask elements may be used to assist in the selective removal of the semiconductor layers 102*a*-102*c*.

In some embodiments, an over etching process is used to partially remove the semiconductor layers 104*a*-104*c* between the epitaxial structures 138N while the semiconductor layers 104*a*-104*c* between the epitaxial structures 138P are covered by a mask element. As a result, the semiconductor nanostructures 1004*a*'-1004*c*' that are thinner are formed, as shown in FIG. 10A. Each of the semiconductor nanostructures 1004*a*'-1004*c*' between the epitaxial structures 138N has a thickness T1, and each of the semiconductor nanostructures 104*a*'-104*c*' between the epitaxial structures 138P has a thickness T2. In some embodiments, the thickness T2 is greater than the thickness T1.

Afterwards, the processes that are the same as or similar to those illustrated in FIG. 3O are performed. As a result, the structure shown in FIG. 10B is formed, in accordance with some embodiments.

Embodiments of the disclosure are not limited thereto. In some other embodiments, the removal of the semiconductor layers 102*a*-102*c* of the fin structure 106A and the removal of the semiconductor layers 102*a*-102*c* of the fin structure 106B are performed simultaneously. Some n-type dopants from the epitaxial structures 138N may diffuse into the semiconductor layers 102*a*-102*c* and/or 104*a*-104*c* of the fin structure 106B. As a result, the semiconductor layers 102*a*-102*c* and/or 104*a*-104*c* of the fin structure 106B may be etched at a faster rate than the semiconductor layers 102*a*-102*c* and/or 104*a*-104*c* of the fin structure 106A. As a result, the semiconductor nanostructures 1004*a*'-1004*c*' that are thinner than the semiconductor nanostructures 104*a*'-104*c*' are formed.

Figure 11:
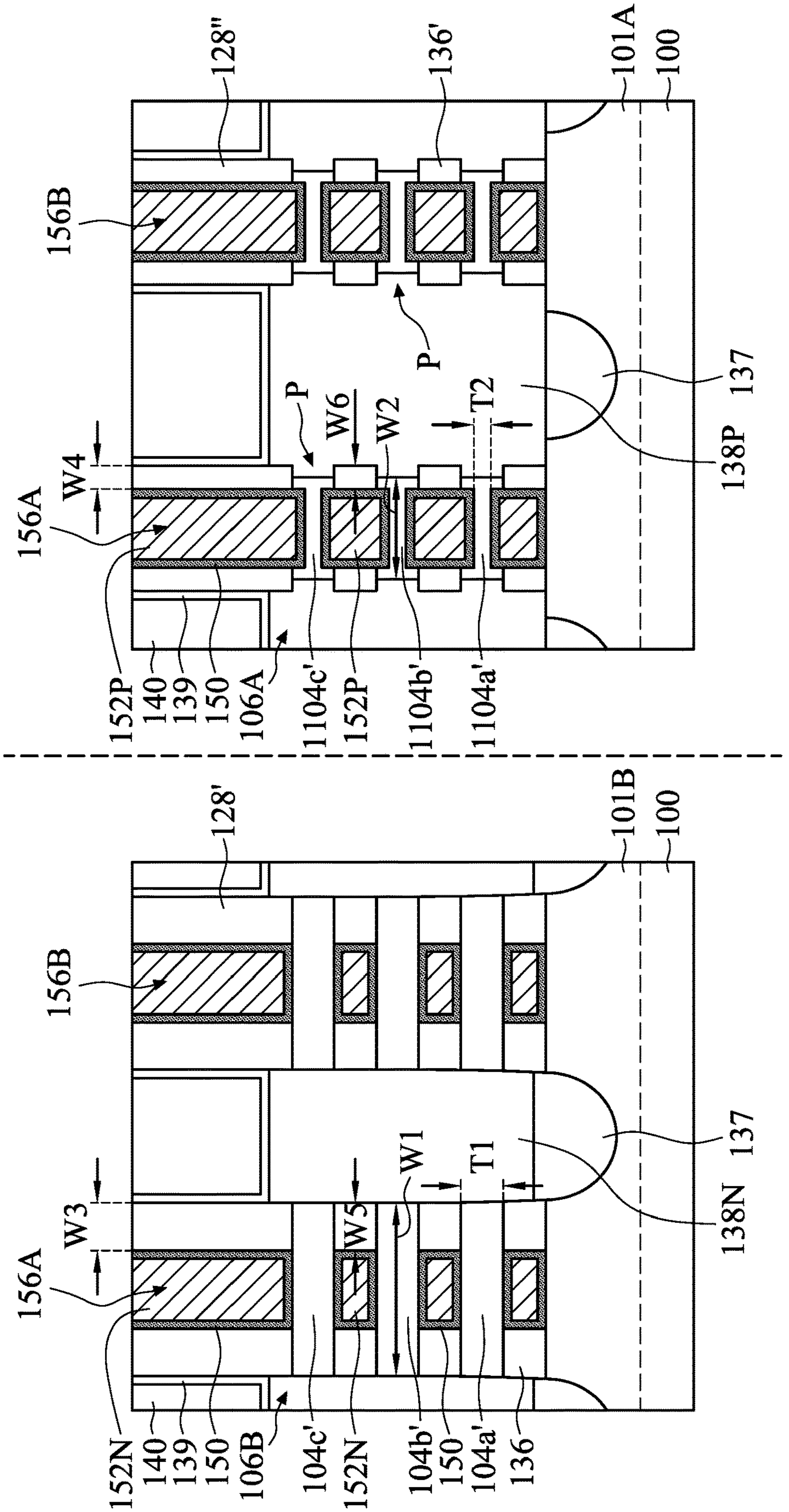
FIG. 11 is a cross-sectional view of portions of a semiconductor device structure, in accordance with some embodiments.

Many variations and/or modifications can be made to embodiments of the disclosure. FIG. 11 is a cross-sectional view of portions of a semiconductor device structure, in accordance with some embodiments. Similar to the embodiments illustrated in FIG. 10A, an over etching process is used to partially remove the semiconductor layers 104*a*-104*c* between the epitaxial structures 138P while the semiconductor layers 104*a*-104*c* between the epitaxial structures 138P are covered by a mask element. As a result, the semiconductor nanostructures 1104*a*'-1104*c*' that are thinner are formed. Each of the semiconductor nanostructures 104*a*'-104*c*' between the epitaxial structures 138N has a thickness T1, and each of the semiconductor nanostructures 1104*a*'-1104*c*' between the epitaxial structures 138P has a thickness T2. In some embodiments, the thickness T1 is greater than the thickness T2.

In some embodiments, the portion of the metal gate stack 156A or 156B over the fin structure 106A is substantially as wide as the portion of the metal gate stack 156A or 156B over the fin structure 106B. However, embodiments of the disclosure are not limited thereto. Many variations and/or modifications can be made to embodiments of the disclosure. In some other embodiments, the portion of the metal gate stack 156A or 156B over the fin structure 106A and the portion of the metal gate stack 156A or 156B over the fin structure 106B have different widths.

Figure 12A:
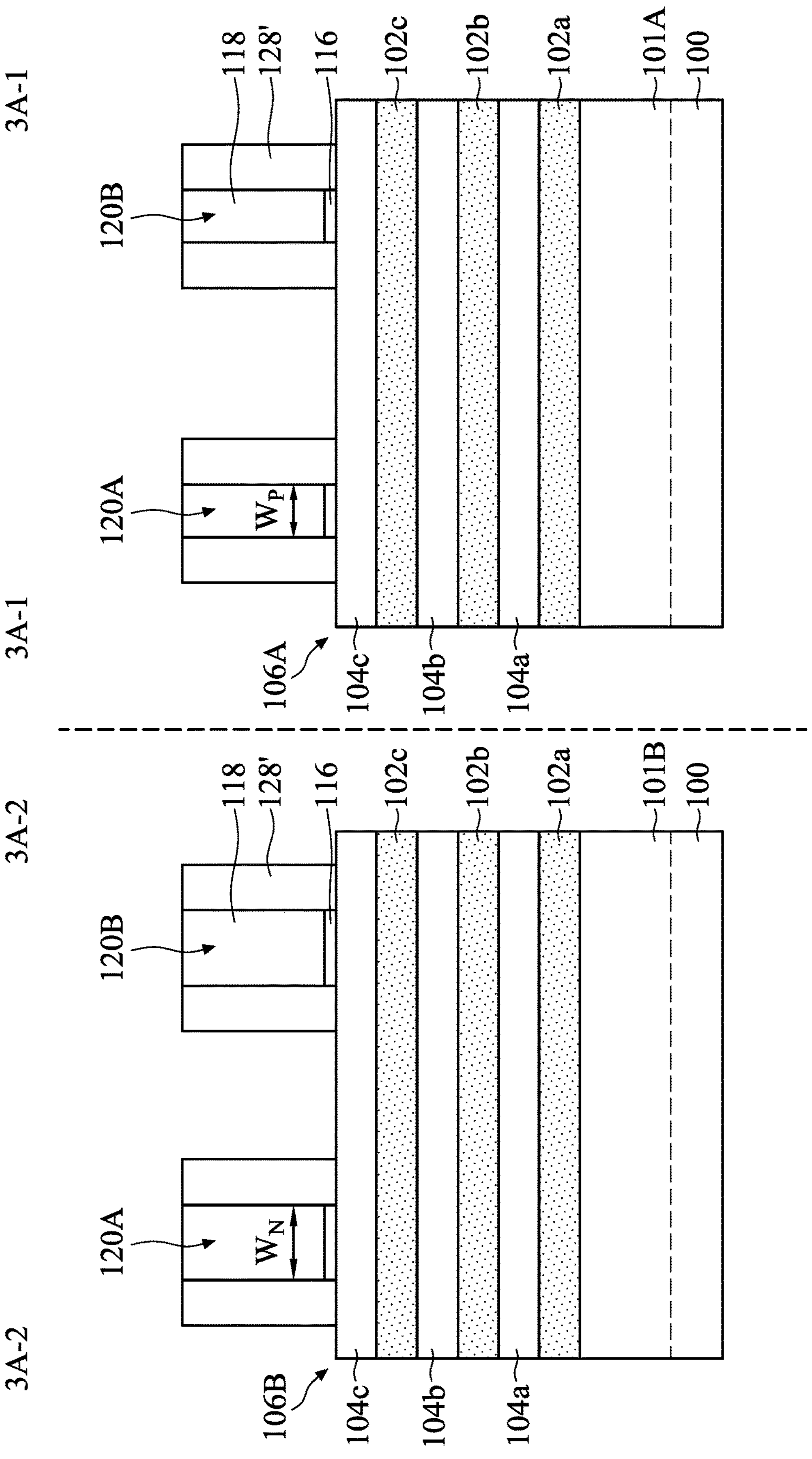
FIGS. 12A-12B are cross-sectional views of various stages of a process for forming portions of a semiconductor device structure, in accordance with some embodiments.
Figure 12B:
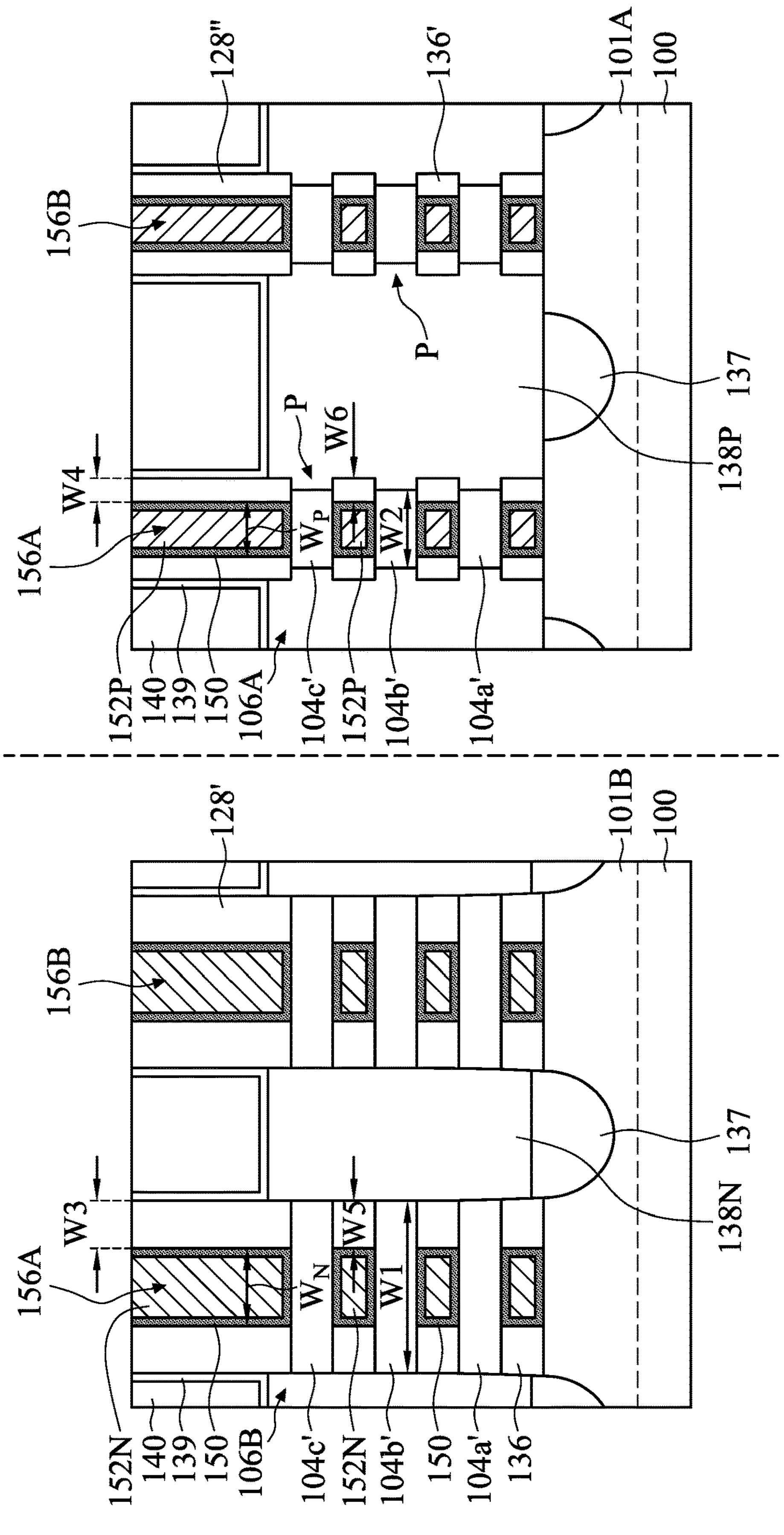

FIGS. 12A-12B are cross-sectional views of various stages of a process for forming portions of a semiconductor device structure, in accordance with some embodiments. As shown in FIG. 12A, a structure that is similar to the structure shown in FIG. 3A is formed. In some embodiments, different portions of each of the dummy gate stacks 120A and 120B is formed to have different widths. As shown in FIG. 12A, the portion of the dummy gate stack 120A has a first portion over the fin structure 106A and a second portion over the fin structure 106B. The first portion has a width $W_P$, and the second portion has a width $W_N$. In some embodiments, the width $W_N$ is wider than the width $W_P$. Similarly, the dummy gate stack 120B is formed to have multiple portions with different widths. In some embodiments, the portion of the dummy gate stack 120B over the fin structure 106A is formed to be narrower than the portion of the dummy gate stack 120B over the fin structure 106B. One or more photolithography processes and one or more etching processes may be used to form the dummy gate stacks 120A and 120B.

Afterwards, the processes that are the same as or similar to those illustrated in FIGS. 3B-3O are performed. As a result, the structure shown in FIG. 12B is formed, in accordance with some embodiments. As shown in FIG. 12B, the portion of the metal gate stack 156A (or 156B) surrounding the semiconductor nanostructures 104*a*'-104*c*' of the fin structure 106A is narrower than the portion of the metal gate stack 156A (or 156B) surrounding the semiconductor nanostructures 104*a*'-104*c*' of the fin structure 106B. The width difference between these two portions of the metal gate stack 156A may be within a range from about 0.5 nm to about 3 nm. By fine-tuning the width difference between the width $W_N$ and $W_P$, the width difference between these two portions of the metal gate stack 156A may be tuned accordingly. Due to the width difference, the semiconductor nanostructures 104*a*'-104*c*' of the fin structure 106B may have lower resistance. The performance and reliability of the semiconductor device structure may be improved.

However, embodiments of the disclosure are not limited thereto. Many variations and/or modifications can be made to embodiments of the disclosure.

Figure 13:
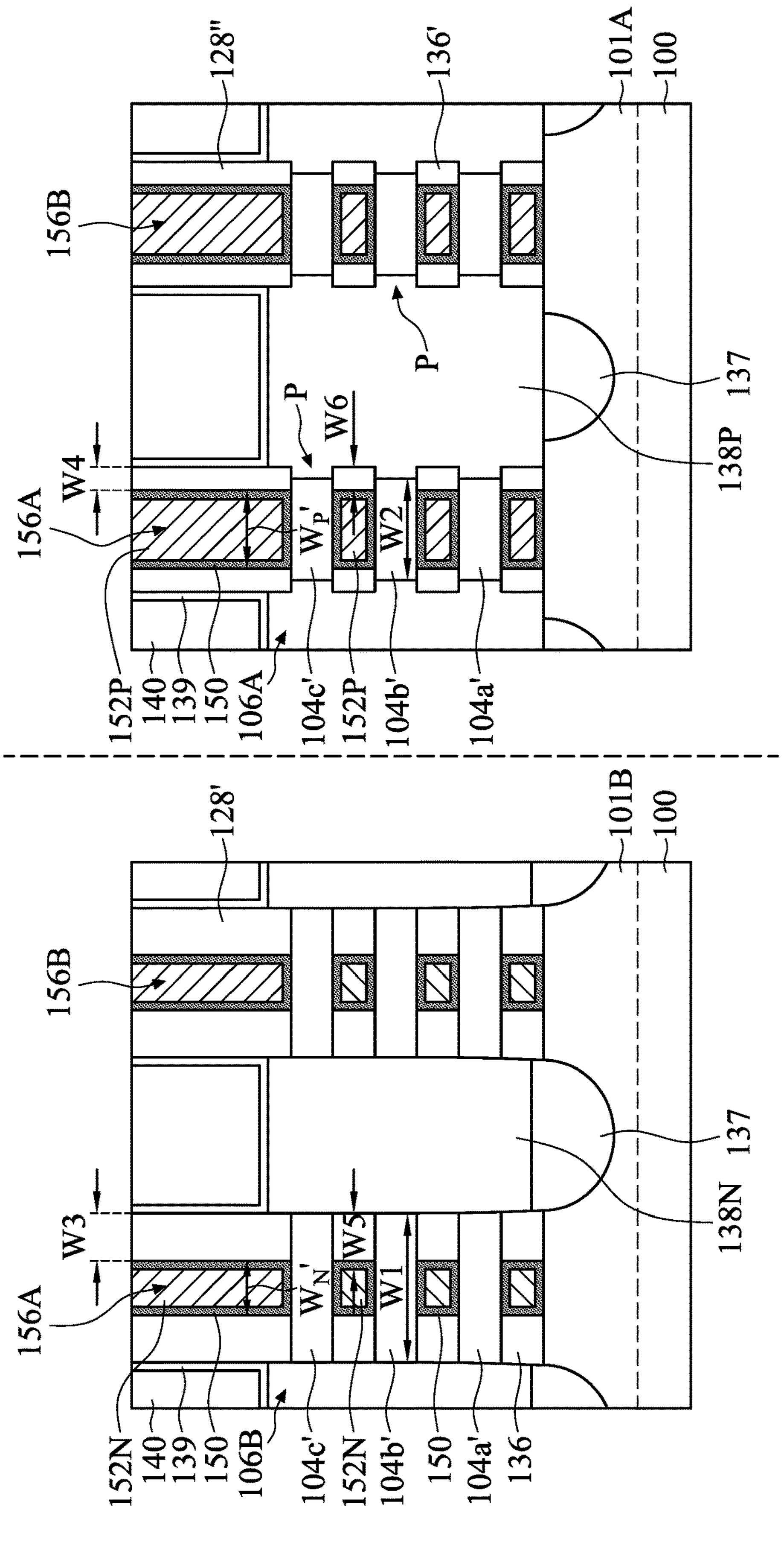
FIG. 13 is a cross-sectional view of portions of a semiconductor device structure, in accordance with some embodiments.

FIG. 13 is a cross-sectional view of portions of a semiconductor device structure, in accordance with some embodiments. In some embodiments, the portion of the metal gate stack 156A (or 156B) surrounding the semiconductor nanostructures 104*a*'-104*c*' of the fin structure 106A is wider than the portion of the metal gate stack 156A (or 156B) surrounding the semiconductor nanostructures 104*a*'-104*c*' of the fin structure 106B. The width difference between these two portions of the metal gate stack 156A may be within a range from about 0.5 nm to about 3 nm. By fine-tuning the width difference between the widths $W_N'$ and $W_P'$, the width difference between these two portions of the metal gate stack 156A may be tuned accordingly. Due to the width difference, the drain-induced barrier lowering of the PMOS devices may be reduced. The performance and reliability of the semiconductor device structure may be improved.

In some embodiments, an upper semiconductor nanostructure is substantially as wide as a lower semiconductor nanostructure. However, embodiments of the disclosure are not limited thereto. Many variations and/or modifications can be made to embodiments. In some other embodiments, an upper semiconductor nanostructure and a lower semiconductor nanostructure have different widths.

Figure 14A:
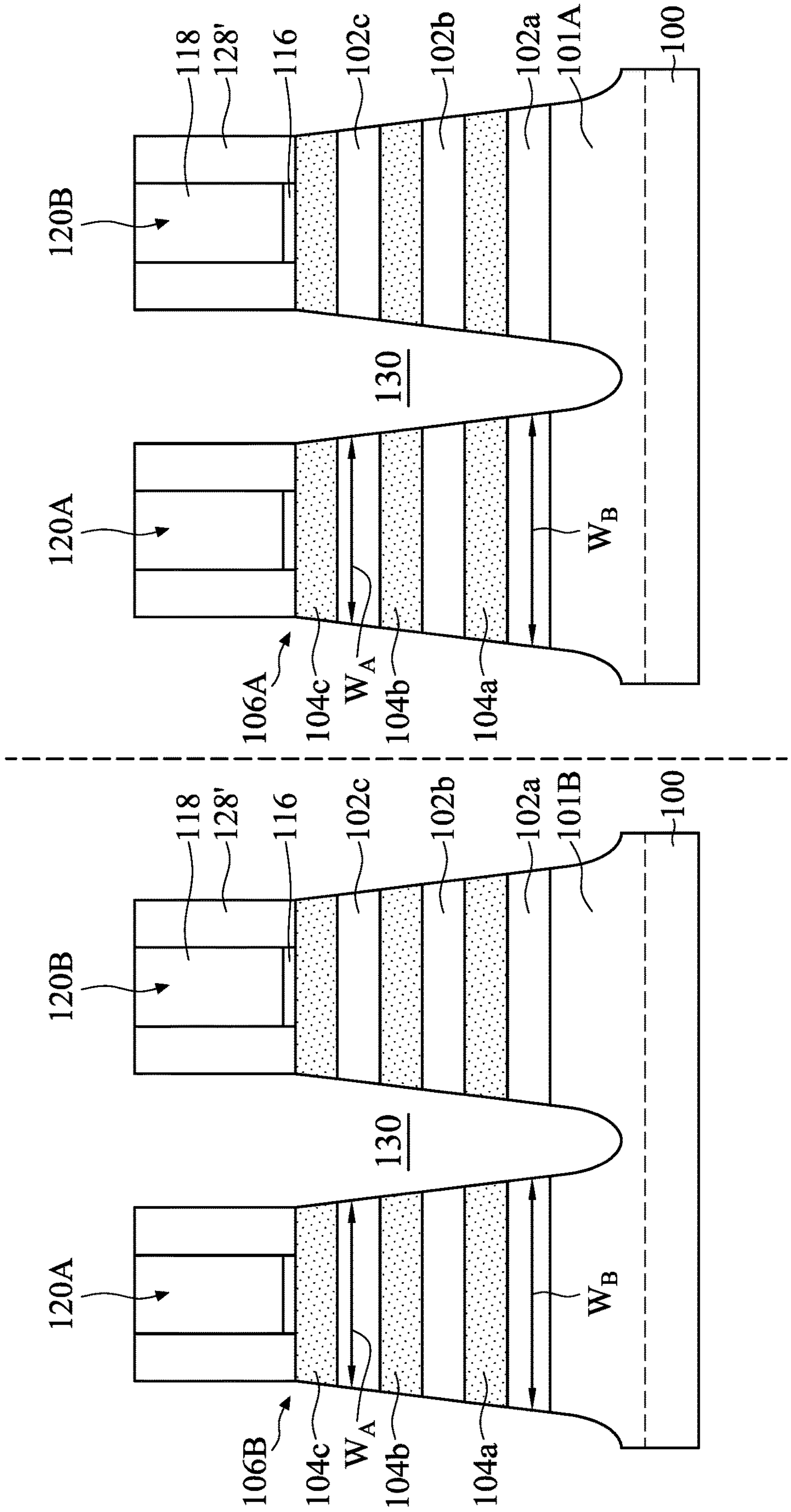
FIGS. 14A-14B are cross-sectional views of various stages of a process for forming portions of a semiconductor device structure, in accordance with some embodiments.
Figure 14B:
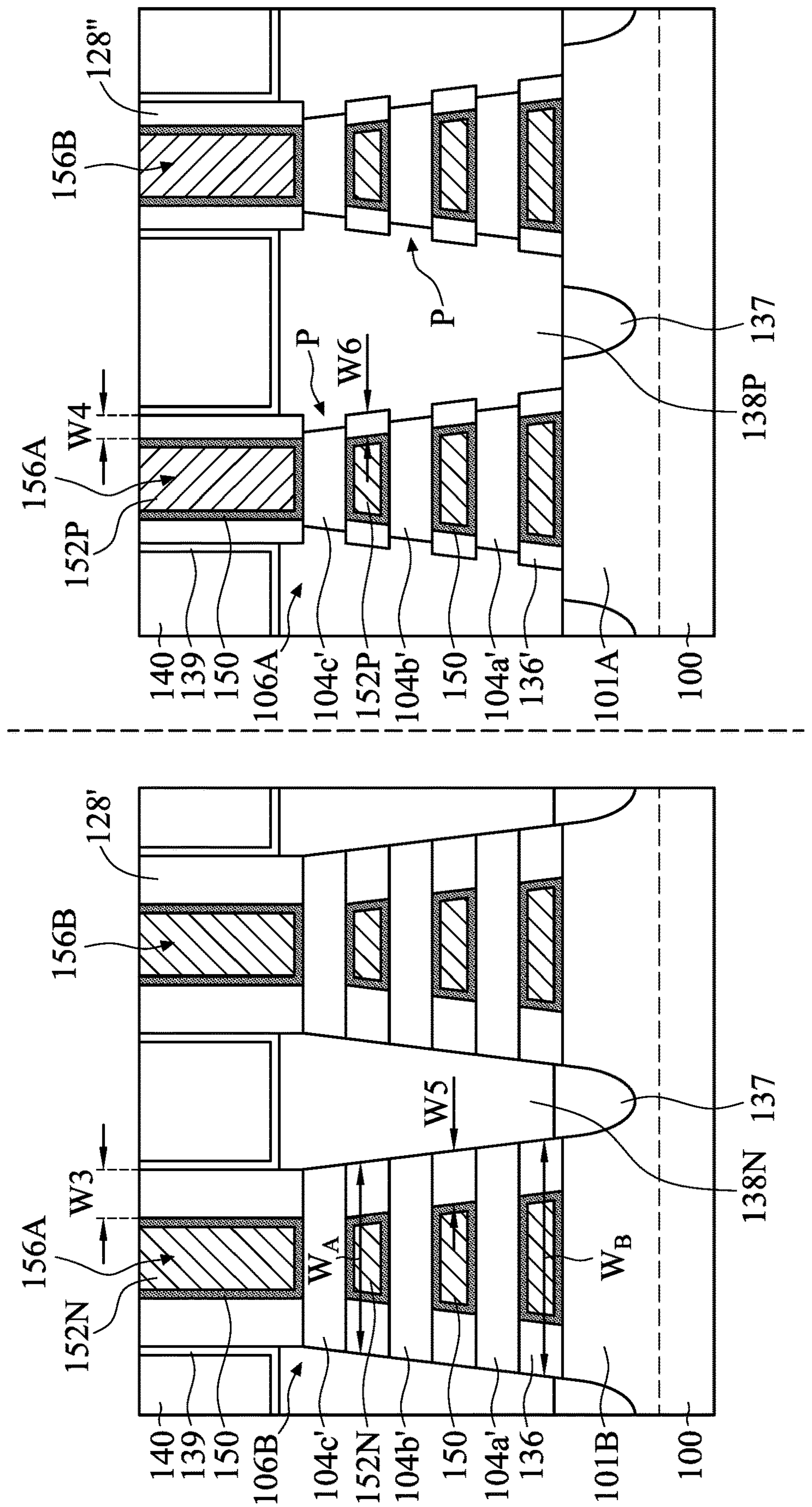

FIGS. 14A-14B are cross-sectional views of various stages of a process for forming portions of a semiconductor device structure, in accordance with some embodiments. As shown in FIG. 14A, a structure that is similar to the structure shown in FIG. 3B is formed. In some embodiments, each of the recesses 130 has slanted sidewalls. Upper portions of the recesses 130 are larger (or wider) than lower portions of the recesses 130. By fine-tuning the etching process for forming the recesses 130, the recesses 130 with the slanted sidewalls may be formed. In these cases, due to the profile of the recesses 130, an upper semiconductor layer (such as the semiconductor layer 102*c* with a width $W_A$) is shorter than a lower semiconductor layer (such as the semiconductor layer 102*a* with a width $W_B$).

Afterwards, the processes that are the same as or similar to those illustrated in FIGS. 3C-3O are performed. As a result, the structure shown in FIG. 14B is formed, in accordance with some embodiments. As shown in FIG. 14B, the lower portion of the metal gate stack 156A (or 156B) is wider than the upper portion of the metal gate stack 156A (or 156B). The metal gate stack 156A (or 156B) may have better leakage control of the semiconductor fin 101A (or 101B) thereunder. The performance and reliability of the semiconductor device structure are improved.

In some embodiments, an upper semiconductor nanostructure is substantially as thick as a lower semiconductor nanostructure. However, embodiments of the disclosure are not limited thereto. Many variations and/or modifications can be made to embodiments. In some other embodiments, an upper semiconductor nanostructure and a lower semiconductor nanostructure have different thicknesses.

Figure 15:
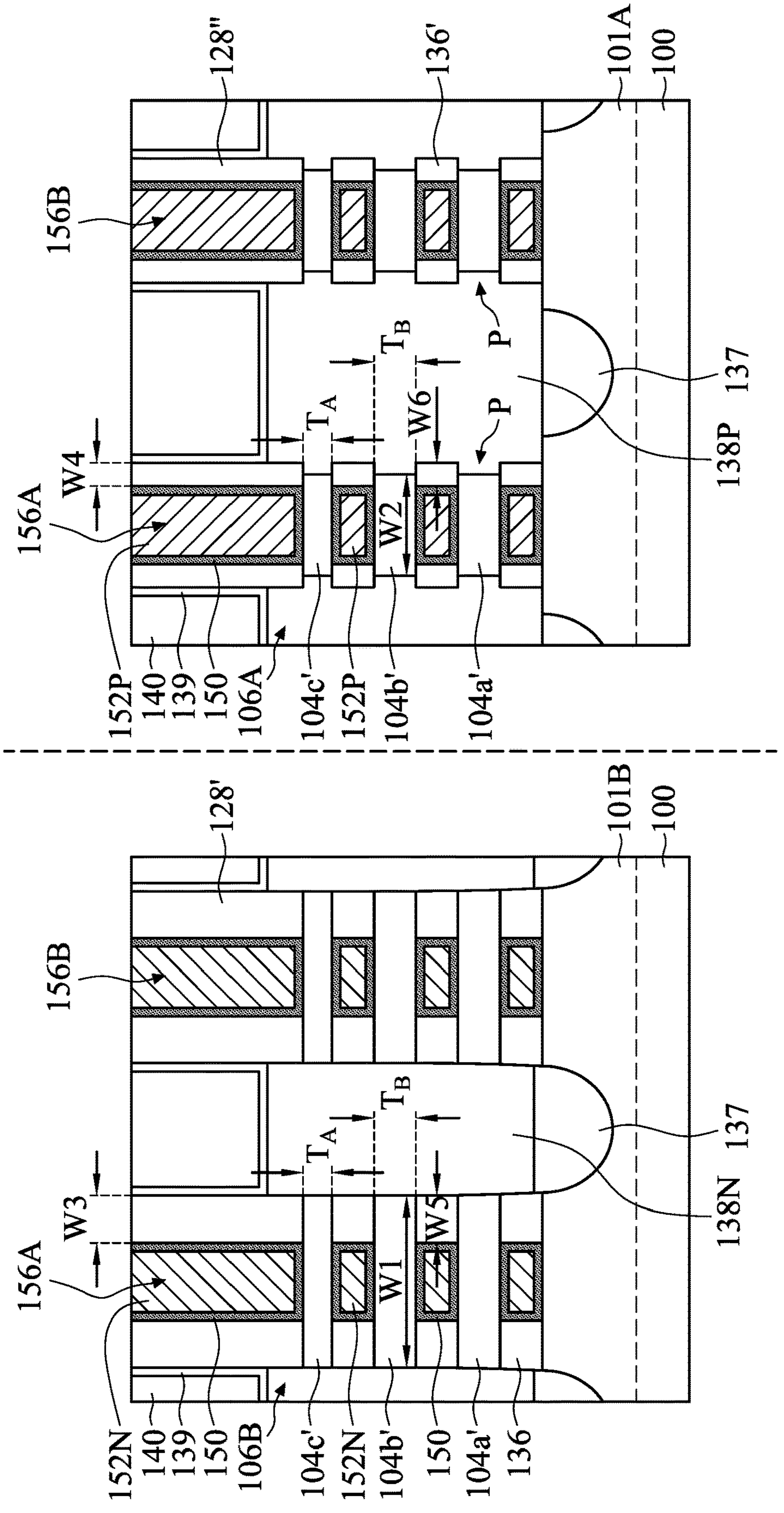
FIG. 15 is a cross-sectional view of portions of a semiconductor device structure, in accordance with some embodiments.

FIG. 15 is a cross-sectional view of portions of a semiconductor device structure, in accordance with some embodiments. As shown in FIG. 15, each of the topmost semiconductor nanostructures 104*c*' has a thickness $T_A$, and each of the lower semiconductor nanostructures 104*b*' and 104*a*' has a thickness $T_B$. In some embodiments, the thickness $T_A$ is thinner than the thickness $T_B$. In some embodiments, the topmost semiconductor layer (such as the semiconductor layer 104*c*) is formed to be thinner than the lower semiconductor layer before the multiple fin structures are formed. Afterwards, the processes that are similar to those illustrated in FIGS. 3A-3O are performed. As a result, the structure shown in FIG. 15 is formed.

In some embodiments, because the semiconductor nanostructures 104*c*' has the thinner thickness $T_A$, the short channel effect control of the top sheet (i.e., the semiconductor nanostructures 104*c*') is improved. In some embodiments, the portion of the epitaxial structure 138N (or 138P) adjacent to the semiconductor nanostructures 104*c*' has a higher dopant concentration than the portion of the epitaxial structure 138N (or 138P) adjacent to the semiconductor nanostructures 104*b*' or 104*a*'.

Embodiments of the disclosure form a semiconductor device structure with a PMOS device and an NMOS device. The PMOS device and the NMOS device are gate-all-around (GAA) transistor structures with gate spacers and inner spacers separating the epitaxial structures from the metal gate stacks. Some of the inner spacers and/or the gate spacers are trimmed according to the characteristics of the PMOS device and/or the NMOS device. The gate spacers and/or inner spacers of the PMOS device and the NMOS device thus have different widths. The performance and reliability of each of the PMOS device and the NMOS device may be improved.

In accordance with some embodiments, a method for forming a semiconductor device structure is provided. The method includes forming a fin structure over a substrate. The fin structure has multiple sacrificial layers and multiple semiconductor layers laid out in an alternating manner. The method also includes partially removing the fin structure to form a recess exposing side surfaces of the semiconductor layers and the sacrificial layers and forming multiple inner spacers covering the side surfaces of the sacrificial layers. The method further includes recessing the semiconductor layers from the side surfaces of the semiconductor layers after the inner spacers are formed and partially removing the inner spacers so that each of the inner spacers becomes thinner. In addition, the method includes forming an epitaxial structure on the side surfaces of the semiconductor layers.

In accordance with some embodiments, a method for forming a semiconductor device structure is provided. The method includes forming a first fin structure and a second fin structure over a substrate. Each of the first fin structure and the second fin structure has multiple sacrificial layers and multiple semiconductor layers laid out in an alternating manner. The method also includes partially removing the first fin structure and the second fin structure to form multiple recesses exposing side surfaces of the semiconductor layers and the sacrificial layers. The method further includes forming multiple inner spacers covering the side surfaces of the sacrificial layers of the first fin structure and the second fin structure and forming n-type doped epitaxial structures on the side surfaces of the semiconductor layers of the first fin structure. In addition, the method includes recessing the semiconductor layers of the second fin structure after the n-type doped epitaxial structures are formed and trimming the inner spacers covering the side surfaces of the sacrificial layers of the second fin structure. The method also includes forming p-type doped epitaxial structures on the side surfaces of the semiconductor layers of the second fin structure.

In accordance with some embodiments, a semiconductor device structure is provided. The semiconductor device structure includes multiple first semiconductor nanostructures and multiple second semiconductor nanostructures. The semiconductor device structure also includes a gate stack wrapped around the first semiconductor nanostructures and the second semiconductor nanostructures. The semiconductor device structure further includes a first epitaxial structure and a second epitaxial structure, and each of the first semiconductor nanostructures is between the first epitaxial structure and the second epitaxial structure. In addition, the semiconductor device structure includes a third epitaxial structure and a fourth epitaxial structure, and each of the second semiconductor nanostructures is between the third epitaxial structure and the fourth epitaxial structure. The semiconductor device structure includes multiple first inner spacers, and each of the first inner spacers is between the gate stack and the first epitaxial structure. The semiconductor device structure also includes multiple second inner spacers. Each of the second inner spacers is between the gate stack and the third epitaxial structure, and each of the first inner spacers is wider than each of the second inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a fin structure over a substrate, wherein the fin structure has a plurality of sacrificial layers and a plurality of semiconductor layers laid out in an alternating manner;

partially removing the fin structure to form a recess exposing side surfaces of the semiconductor layers and the sacrificial layers;

forming a dummy gate stack wrapped around the fin structure;

forming gate spacers over sidewalls of the dummy gate stack before the recess is formed;

forming a plurality of inner spacers covering the side surfaces of the sacrificial layers;

recessing the semiconductor layers from the side surfaces of the semiconductor layers after the inner spacers are formed;

partially removing the inner spacers so that each of the inner spacers becomes thinner;

forming an epitaxial structure on the side surfaces of the semiconductor layers;

forming a second fin structure over the substrate, wherein the second fin structure has a plurality of second sacrificial layers and a plurality of second semiconductor layers laid out in an alternating manner, and the dummy gate stack is wrapped around the second fin structure;

partially removing the second fin structure to form a second recess exposing side surfaces of the second semiconductor layers and the second sacrificial layers;

forming a plurality of second inner spacers covering the side surfaces of the second sacrificial layers;

forming a second epitaxial structure on the side surfaces of the second semiconductor layers, wherein the epitaxial structure and the second epitaxial structure have opposite conductivity types; and partially removing the gate spacers so that portions of the gate spacers near the fin structure become thinner before the epitaxial structure is formed, wherein the gate spacers are partially removed using an etching process, and second portions of the gate spacers near the second fin structure are prevented from being etched by the etching process.

2. The method for forming a semiconductor device structure as claimed in claim 1, further comprising:

partially removing the gate spacers so that portions of the gate spacers become thinner before the epitaxial structure is formed.

3. The method for forming a semiconductor device structure as claimed in claim 1, wherein the inner spacers are partially removed using an etching process, and the second inner spacers are prevented from being etched by the etching process.

4. The method for forming a semiconductor device structure as claimed in claim 1, wherein the recessing of the semiconductor layers from the side surfaces of the semiconductor layer is performed using an etching process, and the second semiconductor layers are prevented from being etched by the etching process.

5. The method for forming a semiconductor device structure as claimed in claim 1, wherein the gate spacers are partially removed before the inner spacers are partially removed.

6. The method for forming a semiconductor device structure as claimed in claim 1, wherein the gate spacers and the inner spacers are partially removed simultaneously.

7. The method for forming a semiconductor device structure as claimed in claim 1, further comprising:

recessing the sacrificial layers from the side surfaces of the sacrificial layers before the inner spacers are formed.

8. A method for forming a semiconductor device structure, comprising:

forming a first fin structure and a second fin structure over a substrate, wherein each of the first fin structure and the second fin structure has a plurality of sacrificial layers and a plurality of semiconductor layers laid out in an alternating manner;

partially removing the first fin structure and the second fin structure to form a plurality of recesses exposing side surfaces of the semiconductor layers and the sacrificial layers;

forming a plurality of inner spacers covering the side surfaces of the sacrificial layers of the first fin structure and the second fin structure;

forming n-type doped epitaxial structures on the side surfaces of the semiconductor layers of the first fin structure;

recessing the semiconductor layers of the second fin structure after the n-type doped epitaxial structures are formed;

trimming the inner spacers covering the side surfaces of the sacrificial layers of the second fin structure; and forming p-type doped epitaxial structures on the side surfaces of the semiconductor layers of the second fin structure.

9. The method for forming a semiconductor device structure as claimed in claim 8, wherein the inner spacers covering the side surfaces of the sacrificial layers of the second fin structure are trimmed after the n-type doped epitaxial structures are formed.

10. The method for forming a semiconductor device structure as claimed in claim 8, further comprising:

forming a dummy gate stack extending across the first fin structure and the second fin structure; and forming gate spacers over sidewalls of the dummy gate stack before the recesses are formed.

11. The method for forming a semiconductor device structure as claimed in claim 10, further comprising:

forming a mask element covering the first fin structure, the n-type doped epitaxial structures, and a first portion of the gate spacers near the first fin structure; and trimming the gate spacers so that a second portion of the gate spacers becomes thinner after the mask element is formed.

12. The method for forming a semiconductor device structure as claimed in claim 10, further comprising:

removing the dummy gate stack and the sacrificial layers to release a plurality of first semiconductor nanostructures constructed by remaining portions of the semiconductor layers of the first fin structure and a plurality of second semiconductor nanostructures constructed by remaining portions of the semiconductor layers of the second fin structure; and forming a metal gate stack wrapped around the first semiconductor nanostructures and the second semiconductor nanostructures.

13. The method for forming a semiconductor device structure as claimed in claim 12, wherein each of the second semiconductor nanostructures is thicker than each of the first second semiconductor nanostructures.

14. A method for forming a semiconductor device structure, comprising:

forming a plurality of sacrificial layers and a plurality of semiconductor layers laid out in an alternating manner;

forming a plurality of inner spacers covering side surfaces of the sacrificial layers;

forming a plurality of second sacrificial layers and a plurality of second semiconductor layers laid out in an alternating manner;

forming a first epitaxial structure on side surfaces of the second semiconductor layer;

recessing the semiconductor layers from side surfaces of the semiconductor layers after the inner spacers and the first epitaxial structure are formed;

trimming the inner spacers after the recessing of the semiconductor layers; and forming a second epitaxial structure on the side surfaces of the semiconductor layers, wherein the second epitaxial structure and the first epitaxial structure have opposite conductivity type.

15. The method for forming a semiconductor device structure as claimed in claim 14, further comprising:

forming a dummy gate stack wrapped around the sacrificial layers and the semiconductor layers;

forming gate spacers over sidewalls of the dummy gate stack before the inner spacers are formed; and partially removing the gate spacers so that portions of the gate spacers become thinner before the second epitaxial structure is formed.

16. The method for forming a semiconductor device structure as claimed in claim 15, wherein the gate spacers are partially removed before the inner spacers are trimmed.

17. The method for forming a semiconductor device structure as claimed in claim 15, wherein the partial removal of the gate spacers and the trimming of the inner spacers are performed simultaneously.

18. The method for forming a semiconductor device structure as claimed in claim 15, wherein the gate spacers are partially removed while a mask element covers the first epitaxial structure, the second sacrificial layers and the second semiconductor layers.

19. The method for forming a semiconductor device structure as claimed in claim 14, further comprising:

forming a mask element covering the first epitaxial structure, the second sacrificial layers and the second semiconductor layers before the recessing of the semiconductor layers from the side surfaces of the semiconductor layers.

20. The method for forming a semiconductor device structure as claimed in claim 19, further comprising:

removing the mask element after the trimming of the inner spacers.

* * * * *